US012276711B2

(12) United States Patent
Ortner et al.

(10) Patent No.: US 12,276,711 B2
(45) Date of Patent: Apr. 15, 2025

(54) SENSOR SYSTEMS, METHOD FOR DETERMINING A POSITION OF A MAGNET SYSTEM, AN OPERATING UNIT, AND A COMPUTER PROGRAM

(71) Applicant: Infineon Technologies AG, Neubiberg (DE)

(72) Inventors: Michael Ortner, Villach (AT); Benjamin Kollmitzer, Pörtschach (AT); Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 6 days.

(21) Appl. No.: 17/718,704

(22) Filed: Apr. 12, 2022

(65) Prior Publication Data

US 2022/0342008 A1    Oct. 27, 2022

(30) Foreign Application Priority Data

Apr. 19, 2021   (DE) .......................... 102021109859.9

(51) Int. Cl.
*G01R 33/00*     (2006.01)
*G01R 33/04*     (2006.01)
*G01R 33/07*     (2006.01)
*G06F 3/0338*    (2013.01)

(52) U.S. Cl.
CPC ..... *G01R 33/0094* (2013.01); *G01R 33/0029* (2013.01); *G01R 33/04* (2013.01); *G01R 33/07* (2013.01); *G06F 3/0338* (2013.01)

(58) Field of Classification Search
CPC ............ G01R 33/0094; G01R 33/0029; G01R 33/04; G01R 33/07; G01R 33/077; G01R 33/091; G01R 33/072; G06F 3/0338; G01D 5/145

See application file for complete search history.

(56) References Cited

U.S. PATENT DOCUMENTS

| | | | | |
|---|---|---|---|---|
| 2012/0262162 | A1* | 10/2012 | Masson | G01D 5/145 324/207.25 |
| 2015/0137796 | A1* | 5/2015 | Ausserlechner | G01D 5/142 324/207.13 |
| 2018/0313933 | A1* | 11/2018 | Hautson | G01S 5/16 |
| 2019/0390983 | A1* | 12/2019 | Bilbao De Mendizabal | G01D 5/245 |
| 2020/0264249 | A1* | 8/2020 | Tayli | G01R 33/5608 |
| 2020/0300602 | A1 | 9/2020 | Mochizuki et al. | |

FOREIGN PATENT DOCUMENTS

| | | |
|---|---|---|
| DE | 102009041989 A1 | 4/2010 |
| DE | 102013000431 A1 | 7/2014 |
| DE | 102015203686 A1 | 9/2016 |

* cited by examiner

*Primary Examiner* — Alvaro E Fortich
(74) *Attorney, Agent, or Firm* — Harrity & Harrity, LLP

(57) ABSTRACT

An exemplary embodiment of a sensor system includes a magnet system which is designed to generate a magnetic field. Furthermore, the sensor system includes a first magnetic field sensor which is movable in a first direction relative to the magnet system and has a first distance from the magnet system in a second direction perpendicular to the first direction. The sensor system also includes a second magnetic field sensor which is movable in the first direction relative to the magnet system and has a second distance from the magnet system in the second direction, the second distance being greater than the first distance.

21 Claims, 30 Drawing Sheets

SENSOR SYSTEMS, METHOD FOR DETERMINING A POSITION OF A MAGNET SYSTEM, AN OPERATING UNIT, AND A COMPUTER PROGRAM

RELATED APPLICATION

This application claims priority to German Patent Application No. 102021109859.9, filed on Apr. 19, 2021, which is incorporated herein by reference in its entirety.

FIELD

Exemplary embodiments relate to sensor systems, methods for determining the position of a magnet system, an operating unit, and a computer program.

BACKGROUND

The position or movement of an object can be determined by means of a sensor system. The position of the object can be determined by means of a magnet which is coupled with the object in a contactless manner. The magnet generates a magnetic field that can be detected by the sensor system and converted into a sensor signal. For example, sensor systems measure the magnetic field strength for two different magnetic field components and accordingly output two phase-shifted sensor signals. The position can be determined based on the sensor signals using an arc tangent function.

Due to external magnetic fields that overlap the magnetic field of the magnet, exact position determination is often only possible to a limited extent. In addition, sensor systems often have (stochastic) measurement errors (e.g., offsets or non-systematic deviations), which can also cause an error in the position determination.

Multiple magnetic sensors are often used to reduce measurement errors due to external interference fields, so that the magnetic field strength can be measured multiple times (e.g., twice or four times) with respect to each magnetic field component.

Due to the arrangement of the magnetic sensors in current position measuring systems and/or the signal evaluation that is implemented, however, errors that occur cannot be sufficiently compensated or reduced. Furthermore, current position measuring systems are not flexible in their design.

This situation is an incentive to provide a better design for sensor systems in order to be able to determine a position better, more easily, more accurately, or with a smaller error. There is also a need for a more flexible design or a simpler or more cost-effective means of producing sensor systems.

SUMMARY

This object can be achieved by the subject matter defined in the independent patent claims.

One exemplary embodiment of a sensor system includes a magnet system which is configured to generate a magnetic field. Furthermore, the sensor system includes a first magnetic field sensor which is movable in a first direction relative to the magnet system and has a first distance from the magnet system in a second direction perpendicular to the first direction. The sensor system also includes a second magnetic field sensor which is movable in the first direction relative to the magnet system and has a second distance from the magnet system in the second direction, the second distance being greater than the first distance. The offset arrangement of the magnetic field sensors perpendicular to the direction of motion allows a position to be determined more precisely or with a smaller error. In addition, the offset arrangement can facilitate a simpler or more compact implementation or more cost-effective production of sensor systems.

One exemplary embodiment of a sensor system includes a magnet system which is configured to generate a magnetic field. Furthermore, the sensor system includes a first magnetic field sensor which is movable relative to the magnet system along a trajectory and has a first distance from the magnet system in a direction perpendicular to the trajectory. The sensor system includes a second magnetic field sensor which is movable parallel to the trajectory of the first magnetic field sensor and relative to the magnet system and has a second distance to the magnet system in the direction perpendicular to the trajectory, the second distance being greater than the first distance. The offset arrangement of the magnetic field sensors perpendicular to the direction of motion allows a position to be determined more precisely or with a smaller error. In addition, the offset arrangement can facilitate a simpler or more compact implementation or more cost-effective production of sensor systems. The sensor system can also be used for non-linear movements of the magnetic field sensors relative to the magnet system.

One exemplary embodiment relates to a method for determining a position of a magnet system. The method includes determining a first signal by means of a first magnetic field sensor which is movable in a first direction relative to the magnet system and has a first distance from the magnet system in a second direction perpendicular to the first direction. Furthermore, the method includes determining a second signal by means of a second magnetic field sensor which is movable in the first direction relative to the magnet system and has a second distance from the magnet system in the second direction, the second distance being greater than the first distance. The method also includes determining a relative position between the first magnetic field sensor and the magnet system in the first direction by using the first signal and the second signal. Based on the signals of the magnetic field sensors, which are offset in the direction perpendicular to the direction of motion, a position can be determined more precisely or with a smaller error. In addition, a position can be determined using a sensor system which is more compact, cost-effective, or simpler to implement.

One exemplary embodiment relates to a method for determining a position of a magnet system. The method includes determining a first signal by means of a first magnetic field sensor which is movable relative to the magnet system along a trajectory and has a first distance from the magnet system in a direction perpendicular to the trajectory. Furthermore, the method includes determining a second signal by means of a second magnetic field sensor which is movable parallel to the trajectory of the first magnetic field sensor and relative to the magnet system and has a second distance from the magnetic system in the direction perpendicular to the trajectory, the second distance being greater than the first distance. The method also includes determining a relative position between the first magnetic field sensor and the magnet system in a direction of motion of the magnetic field sensors by using the first signal and the second signal. Based on the signals of the magnetic field sensors, which are offset in the direction perpendicular to the direction of motion, a position can be determined more precisely or with a smaller error. In addition, a position can be determined using a sensor system which is more compact, cost-effective, or simpler to implement. The method for determining the position can also be used for non-linear movements of magnetic field sensors relative to the magnet system.

BRIEF DESCRIPTION OF THE DRAWINGS

Some examples of systems and/or methods are described in more detail in the following with reference to the accompanying figures, purely as examples. In the drawings.

DETAILED DESCRIPTION

Some examples are now described in more detail with reference to the accompanying figures. However, other possible examples are not limited to the features of these embodiments described in detail. These can have modifications of the features as well as equivalents and alternatives to the features. In addition, the terminology that is used here to describe specific examples, is not intended to be limiting for other examples.

Identical or similar reference signs refer throughout the description of the figures to the same or similar elements or features, which may each be implemented identically or in modified form although they provide the same or a similar function. In the figures, the thicknesses of lines, layers and/or regions may be shown exaggerated for the sake of clarity.

If two elements A and B are combined using an "or", this should be understood to mean that all possible combinations are disclosed, i.e., only A, only B, as well as A and B, unless explicitly defined otherwise in individual cases. An alternative formulation that can be used for the same combinations is "at least one of A and B" or "A and/or B". An equivalent formulation applies to combinations of more than two elements.

If a singular form, e.g., "a, an" and "the" is used and the use of only a single element is neither explicitly nor implicitly defined as mandatory, then other examples may also use a plurality of elements to implement the same function. If a function is described in the following as being implemented using a plurality of elements, further examples may implement the same function by using a single element or a single processing entity. It also goes without saying that the use of the terms "comprises", "comprising", "has" and/or "having" precisely defines the presence of the specified features, integers, steps, operations, processes, elements, components and/or a group of the same, but not the presence or the addition of one or more other features, integers, steps, operations, processes, elements, components and/or a group of the same.

Figure 1A:
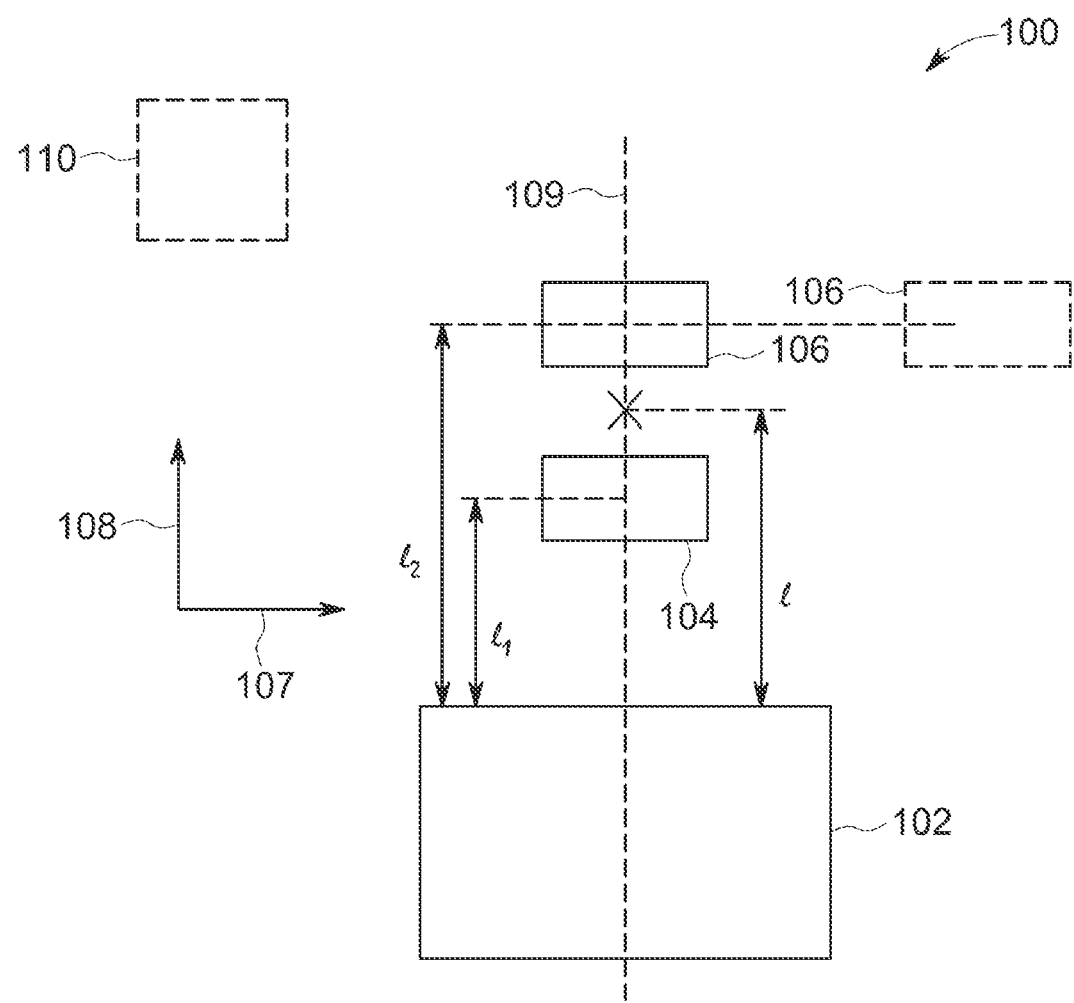
FIG. 1a shows an exemplary embodiment of a sensor system.

FIG. 1a shows an exemplary embodiment of a sensor system 100. The sensor system 100 comprises a magnet system 102 which is configured to generate a magnetic field. Furthermore, the sensor system 100 comprises a first magnetic field sensor 104 which is movable in a first direction 107 relative to the magnet system 102 and has a first distance $l_1$ from the magnet system 102 in a second direction 108 perpendicular to the first direction. The sensor system 100 also comprises a second magnetic field sensor 106, which is movable in the first direction 107 relative to the magnet system 102 and has a second distance $l_2$ from the magnet system 102 in the second direction 108, the second distance $l_2$ being greater than the first distance $l_1$. The magnet system 102 can generate a (characteristic) magnetic field that can be detected by the two magnetic field sensors 104 and 106. When a relative movement of the magnetic field sensor 104, 106 occurs with respect to the magnet system 102, the magnetic field sensors 104, 106 can measure different magnetic field strengths and generate corresponding sensor signals. The magnetic field sensors 104, 106 are offset at least in the direction 108 perpendicular to the direction of motion of the magnetic field sensors 104, 106 and can each generate different sensor signals. The sensor signals can be used to determine the relative position between the magnetic field sensor 104, 106 and the magnet system 102. The offset arrangement of the magnetic field sensors 104, 106 with respect to the direction 108 perpendicular to the direction of motion allows a position to be determined more precisely or with a smaller error. Furthermore, a position determination can be facilitated by means of a sensor system 100 which comprises an arrangement of magnetic field sensors 104,

106, offset with respect to the direction of motion. Sensor systems 100 with this arrangement can have a more compact design or generally more advantageous dimensions for an application or can be produced or implemented more easily or cost-effectively.

The first and the second magnetic field sensors 104 and 106 can detect the magnetic field of the magnet system 102 and output a first signal and a second signal accordingly. Depending on the arrangement of the first and second magnetic field sensors 104, 106 relative to the magnet system 102 the first signal can differ from the second signal, e.g., in its amplitude (and optionally in its phase). The measuring principle of the magnetic field sensors 104, 106 is based, for example, on a magnetoresistive effect (AMR, GMR, TMR sensor). According to another example, the first and second magnetic field sensors (104, 106) can be Hall sensors or fluxgate magnetometers. Compared to other magnetic field sensors, (vertical) Hall sensors and fluxgate magnetometers can provide information about the direction of the magnetic field (e.g., angle) and additionally about a magnetic field strength (vector length). Hall sensors and fluxgate magnetometers or other (linear) sensors of this kind can enable a position determination with a vector length measurement (see other designs in connection with the signal processing circuit, e.g., in conjunction with FIG. 8*b*-*c*). Another aspect is that Hall sensors and their components can be implemented on a common chip.

In general, magnetic field sensors 104, 106 of the sensor system 100 can be implemented on a common chip, on separate chips, on a common substrate or carrier (such as a printed circuit board), in a common chip package, or in separate chip packages.

For example, the first and second magnetic field sensors 104, 106 are each two-dimensional magnetic field sensors which are sensitive in the first direction (e.g., x-direction) and the second direction (e.g., z-direction). Two-dimensional magnetic field sensors can measure a first component of the magnetic field (e.g., along the first direction 107) and a second component of the magnetic field (e.g., along the second direction 108) and generate a sensor signal for each component. A sensor system with two 2D magnetic field sensors can output a total of four sensor signals. According to another example, the magnetic field sensors can be three-dimensional magnetic field sensors that are sensitive in the first direction, the second direction and a third direction, e.g., perpendicular to the first and second direction. In the case of three-dimensional magnetic field sensors, it may be sufficient to evaluate sensor signals from two components for the position determination. In the following description, a magnetic field sensor can be referred to as a pixel.

A (multidimensional) magnetic field sensor can comprise a plurality of sensor elements (e.g., Hall elements), each of which is sensitive in different directions. For example, a sensor system that can determine a relative position in the millimeter or centimeter range comprises sensor elements with dimensions less than or equal to $100 \times 100$ μm$^2$. In the following, a system of (multidimensional) magnetic field sensors can generally be referred to as a sensor, and a sensor element generally as a component (of the magnetic field sensor).

The distance $l_1$ of the first magnetic field sensor and the distance $l_2$ of the second magnetic field sensor are different with respect to the second direction 108. The distances between the two magnetic field sensors can remain (predominantly) unchanged in general or in the case of a movement of the magnetic field sensors relative to the magnet system along the first direction. According to the exemplary embodiment in FIG. 1*a*, the first and the second magnetic field sensor 104, 106 can be arranged on a common straight line 109 running in the second direction. In this arrangement, the straight line 109 and the first direction can enclose an angle of 90°. A sensor system with this arrangement of magnetic field sensors can be referred to below as a sensor system with a perpendicular arrangement, with a 90° layout or as a 2pxPerp sensor system. As shown in FIG. 1*a*, the distances l1 and l2 of the magnetic field sensors 104, 106 can be defined in each case from a center of the respective magnetic field sensors 104, 106 to a (e.g., nearest with respect to the second direction) surface of the magnet system 102. As shown in FIG. 1*a*, a distance l, which can also be referred to below as a "gap", can be defined from a center of the two magnetic field sensors 104, 106 to the nearest surface of the magnet system. For example, the distance l can be less than 5 mm, less than 4 mm, or less than 2 mm. The first magnetic field sensor and the second magnetic field sensor can be arranged offset from each other by a (e.g., inter-pixel) distance $\Delta l = l_2 - l_1$, which is e.g., less than 2 mm, less than 1.8 mm or less than 1.5 mm. An (intra-pixel) distance between the sensor elements of a magnetic field sensor can be less than the inter-pixel distance, e.g., less than 1 mm. In the other designs, relationships (such as correlations) between two components of different magnetic field sensors can be described by the term "inter-pixel" and between two components of a single (same) magnetic field sensor by the term "intra-pixel".

As indicated in FIG. 1*a* by the dashed lines, the second magnetic field sensor 106 can additionally be optionally offset from the first magnetic field sensor 104 with respect to the first direction 107. For example, the first magnetic field sensor 104 can be connected to the second magnetic field sensor 106 via a straight line which encloses an angle of more than 45°, more than 60°, more than 70° or more than 80° with the first direction 107. The following statements, which refer to a perpendicular arrangement of the sensor system (e.g., 2pxPerp sensor systems), can partly or wholly refer to sensor systems with an arrangement other than 90°, provided these sensor systems have an offset arrangement of magnetic field sensors perpendicular to the direction of motion according to the proposed design.

The relative motion of the magnetic field sensors with respect to the magnet system can be linear. The sensor system can be a linear position measuring system. The magnetic field sensors can move along the first direction on a straight line (one-dimensionally), so that the distance between the magnetic field sensors and the magnet system in the second direction can remain essentially unchanged during the movement of the magnetic field sensors. The relative position between the magnetic field sensors and the magnet system can be specified, for example, in millimeters (or another unit of length), degrees or radians (angle), or in percent (relative to a reference position).

Further details and optional aspects of the sensor system 100 are described in conjunction with the proposed approach or with one or more of the examples described below.

In another exemplary embodiment of the sensor system, the relative motion can be a non-linear motion, such as a circular or generally multidimensional motion.

Figure 1B:
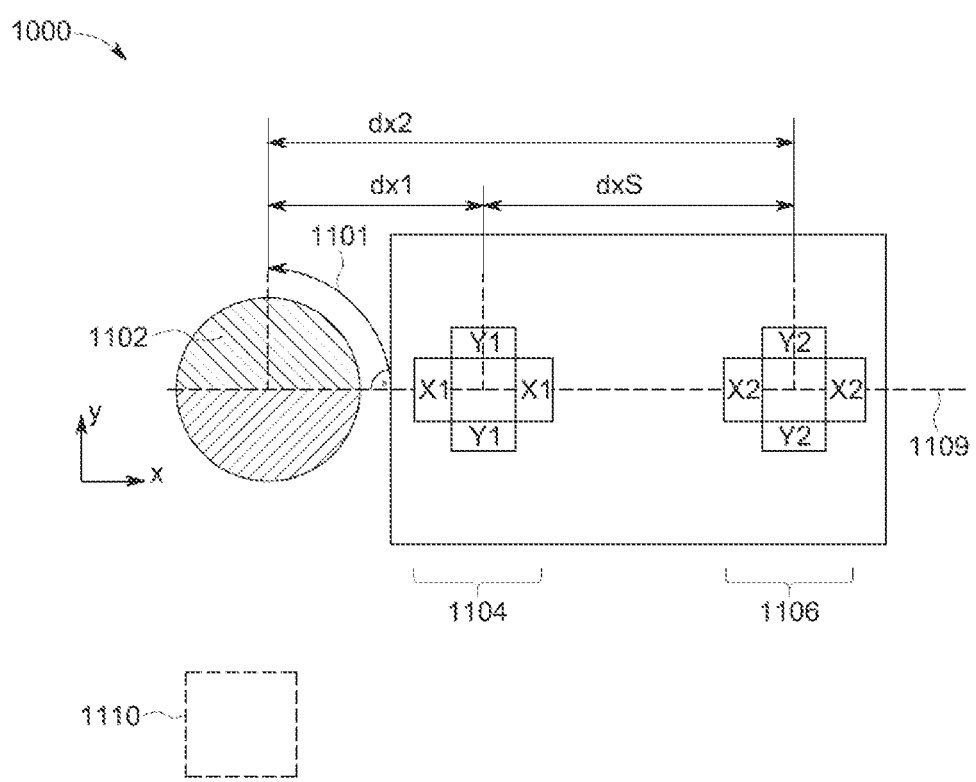
FIG. 1b shows another exemplary embodiment of a sensor system.

FIG. 1B shows an exemplary embodiment of a sensor system 1000. The sensor system 1000 comprises a magnet system 1102 which is configured to generate a magnetic field. Furthermore, the sensor system 1000 comprises a first magnetic field sensor 1104, which is movable relative to the magnet system 1102 along a trajectory 1101 and has a first distance (dx1) from the magnet system 1102 in a direction perpendicular to the trajectory. The sensor system 1000 also comprises a second magnetic field sensor 1106, which is movable parallel to the trajectory 1101 of the first magnetic field sensor 1104 and relative to the magnet system 1102 and has a second distance (dx2) from the magnet system 1102 in the direction perpendicular to the trajectory, the second distance being greater than the first distance. As shown by way of example in FIG. 1B, the trajectory is a circular path around the magnet system 1102. The magnetic field sensors can move around the magnet system 1102 together on the x-y plane in a circle. The first and the second magnetic field sensor 1104, 1106 can be arranged, as shown, on a common straight line 1109, which runs perpendicular to the trajectory. The magnetic field sensors 1104, 1106 can be arranged offset in a radial direction (in relation to the magnet system 1102) and detect different magnetic fields. Using a first signal from the first magnetic field sensor and a second signal from the second magnetic field sensor, a relative position between the first or second magnetic field sensor 1104, 1006 and the magnet system 1102 can be determined in the direction of motion of the magnetic field sensors. For example, the relative position can be determined (optionally) using a signal processing circuit 1110.

In the example shown, the magnet system 1102 is a diametrically polarized magnet. Each magnetic field sensor can have a plurality of sensor elements of the same sensitivity (e.g., in the x-direction or y-direction) to reduce an error with respect to a superimposed external magnetic field. In general, the magnetic field sensors 1104, 1106 can be implemented in the same or a similar way to the magnetic field sensors 104, 106 of the sensor system 100 in FIG. 1a.

According to another exemplary embodiment of a sensor system, a first and second magnetic field sensor can be a part of a joystick. The trajectory along which the first and second magnetic field sensors can move can result from a movement of the joystick. In general, the magnetic field sensors can be moved relative to a magnet system in such a way that a difference signal between a first signal of the first magnetic field sensor and a second signal of the second magnetic field sensor can be in phase with the first signal and the second signal. For (predominantly) equal-phase sensor signals, it would be possible to determine a position with a smaller error (see further details in connection with FIG. 7c-7h).

Further details and optional aspects of the sensor system 1000 are described in conjunction with the proposed design or one or more of the examples described above (in connection with the sensor system 100 of FIG. 1a) or below. In the following description, further explanations and aspects can relate to the sensor system 100 which was described in connection with FIG. 1a. It should be understood that these explanations and aspects may relate in the same or a similar way to the sensor system 1000 described in conjunction with FIG. 1B.

Figure 2:
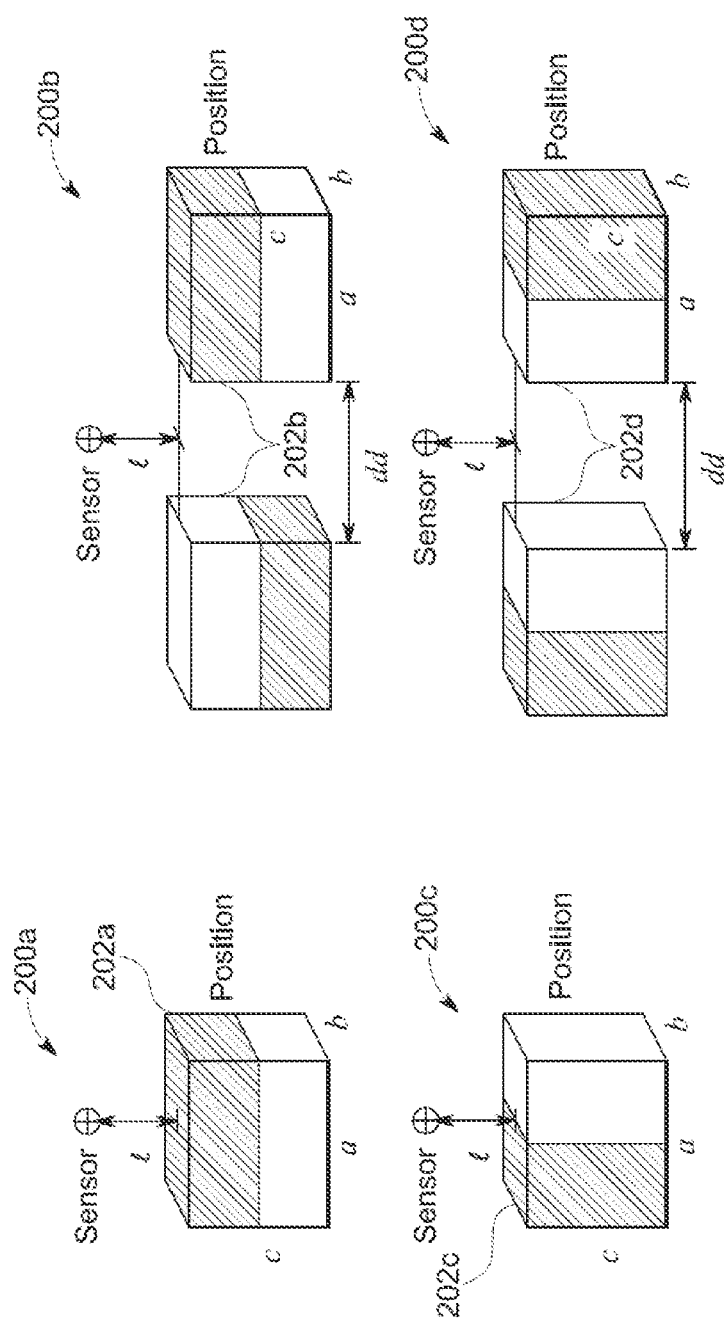
FIG. 2 shows exemplary embodiments of sensor systems with different magnet systems.

The magnet system 102 of the sensor system 100 (or the sensor system 1000 of FIG. 1B) can contain one, two or more magnets, such as permanent magnets. FIG. 2 shows exemplary embodiments of sensor systems 200a-d with different magnet systems 202a-d, which are each arranged offset from the sensor by a distance l with respect to the second direction. Other aspects of the sensor systems 200a-d can be implemented in a similar way to the sensor system 100, 1000, described in conjunction with FIG. 1a-b. The sensor system 200a has a single dipole magnet 202a and the sensor system 200b has two dipole magnets 202b as a magnet system, each with a transverse orientation. The sensor system 200c has a single dipole magnet 202c and the sensor system 200d has two dipole magnets 202d as a magnet system, each with an axial orientation. Other magnet systems may include more than two magnets, encoders with multiple magnetic elements or, in general, objects which can generate a characteristic magnetic field for position determination by interacting with an applied magnetic field.

Figure 3:
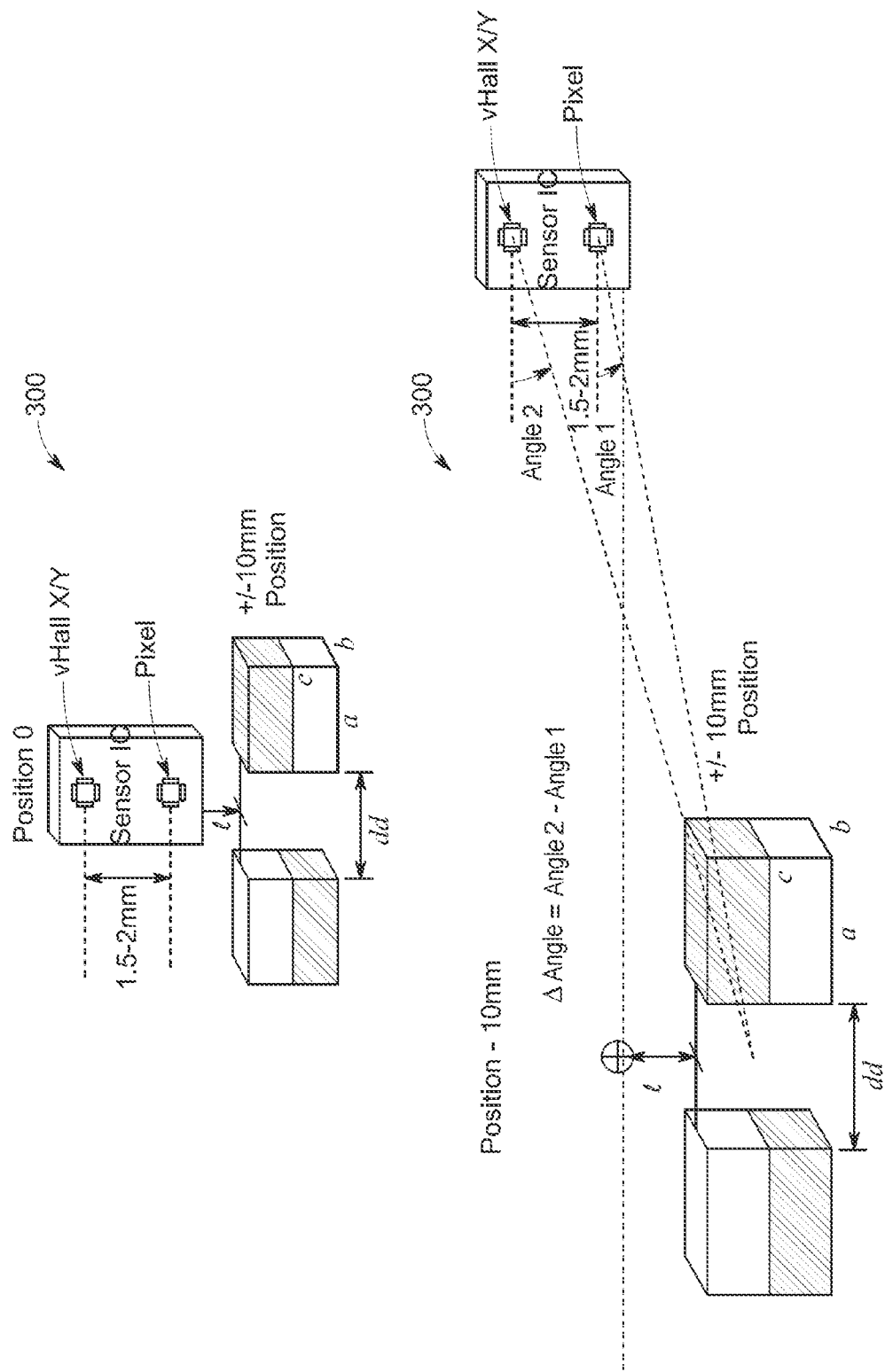
FIG. 3 shows an exemplary embodiment of a sensor system for two different relative positions.

Due to the movement of the magnetic field sensors relative to the magnet system, the relative position can change with respect to the first direction and can be determined by means of the sensor system. FIG. 3 shows another exemplary embodiment of a sensor system 300 in a first arrangement (FIG. 3, top) with a relative position of 10 mm and in a second arrangement (FIG. 3, below) with a relative position of −10 mm. The sensor system 300 can be implemented in a similar way to the sensor systems described above in connection with FIGS. 1a-b and 2. The sensor system 300 has two dipole magnets with transverse orientation. For example, the relative position may be defined from a center of the first magnetic field sensor, the second magnetic field sensor and/or the sensor, to a center of the magnet system with respect to the first direction. As shown in the example of FIG. 3 (bottom), the first magnetic field sensor can enclose a first angle and the second magnetic field sensor can enclose a second angle to a center of the magnet system with respect to the first direction. The two angles can differ by $\Delta Angle = Angle2 - Angle1$. For example, the relative position can be determined from the angle difference.

As indicated in FIG. 1a-b by the dashed lines, the sensor system 100, 1000 can optionally comprise a signal processing circuit 110. The signal processing circuit 110 can be configured to determine a relative position between the first magnetic field sensor 104 and the magnet system 102 in the first direction 107 by using the first signal of the first magnetic field sensor 104 and the second signal of the second magnetic field sensor 106. The position determination can be determined more precisely or with a smaller error by means of the sensor system 100, 1000. An error in the position determination can be caused, for example, by an external magnetic field (e.g., magnetic stray field), which is superimposed on the magnetic field of the magnet system. Due to the superimposed external magnetic field, the magnetic field sensors 104, 106 can detect a magnetic field strength (offset) that is too high or too low and accordingly output an incorrect sensor signal. Deviating sensor signals can in turn lead to inaccuracy or a relative position error. Furthermore, (stochastic, unsystematic) measurement errors of the magnetic field sensors (e.g., fluctuation, drift) can lead to an error in the relative position.

Figure 4A:
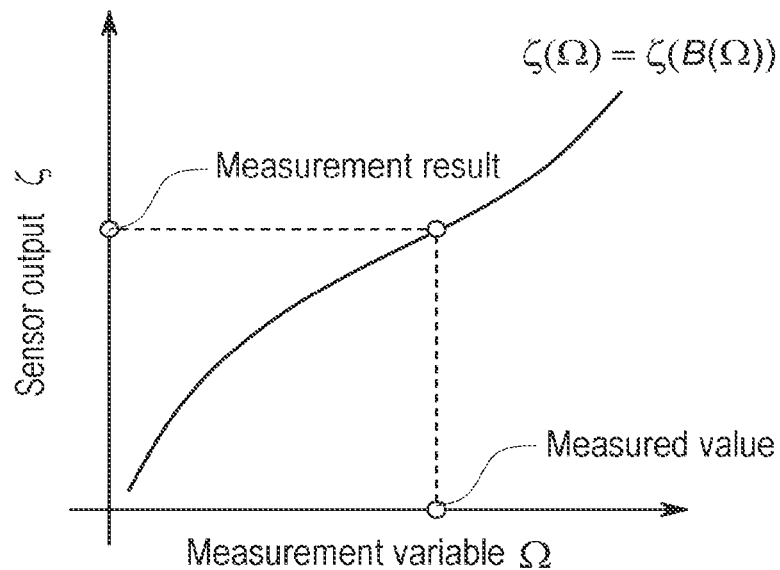
FIGS. 4a-4c shows examples of sensor outputs with and without measurement errors.
Figure 4B:
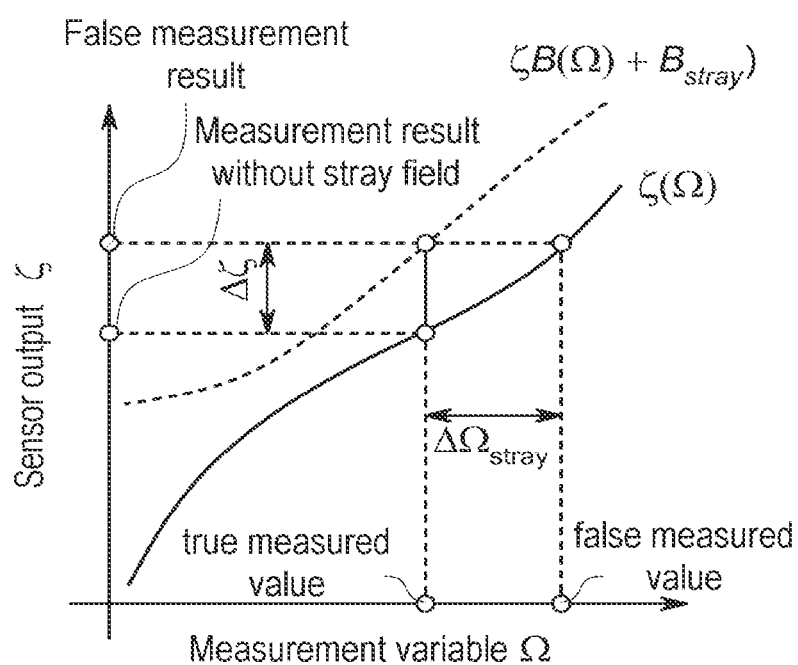
Figure 4C:
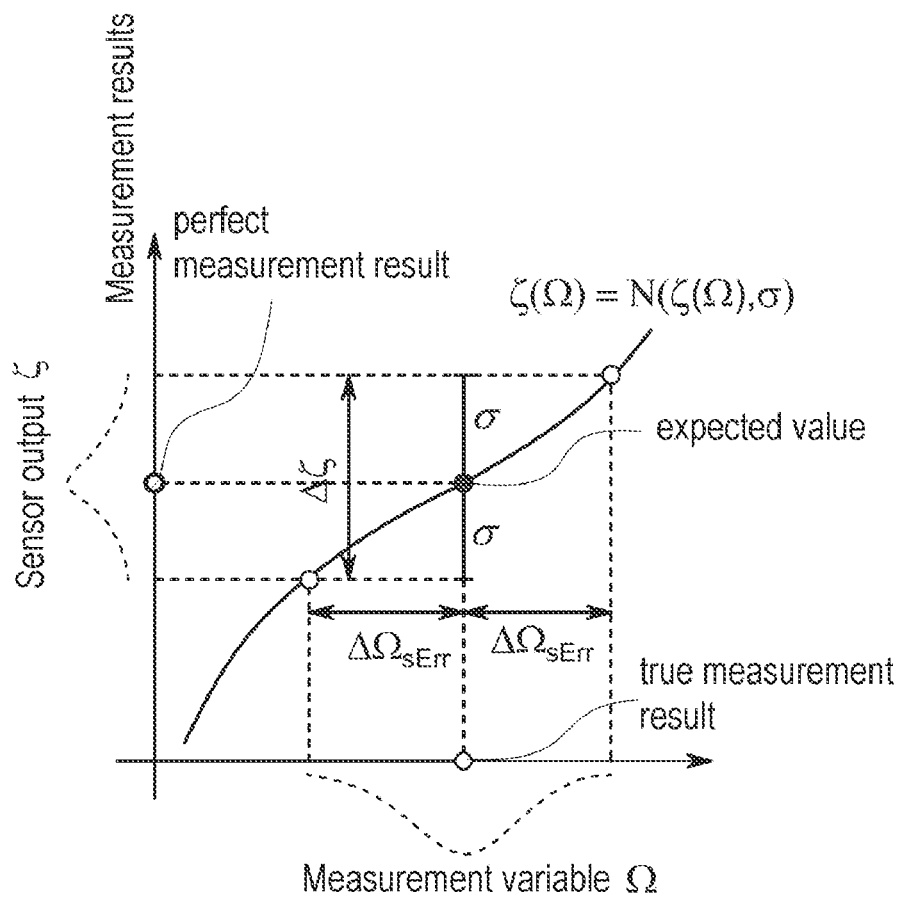

FIGS. 4a-c contrast examples of outputs of sensors with and without measurement errors (error-free and errorful states). In an ideal state, the applied magnetic field can be measured without measurement errors so that the relative position can be determined precisely (see FIG. 4a). In real conditions with an external superimposed magnetic field (e.g., $B_{stray}$), a measurement error can occur, so that the output sensor signal contains an offset (see FIG. 4b). In a real conditions with stochastic errors affecting the magnetic field sensors, sensor outputs can show a scatter (with standard deviation $\sigma$).

Figure 5:
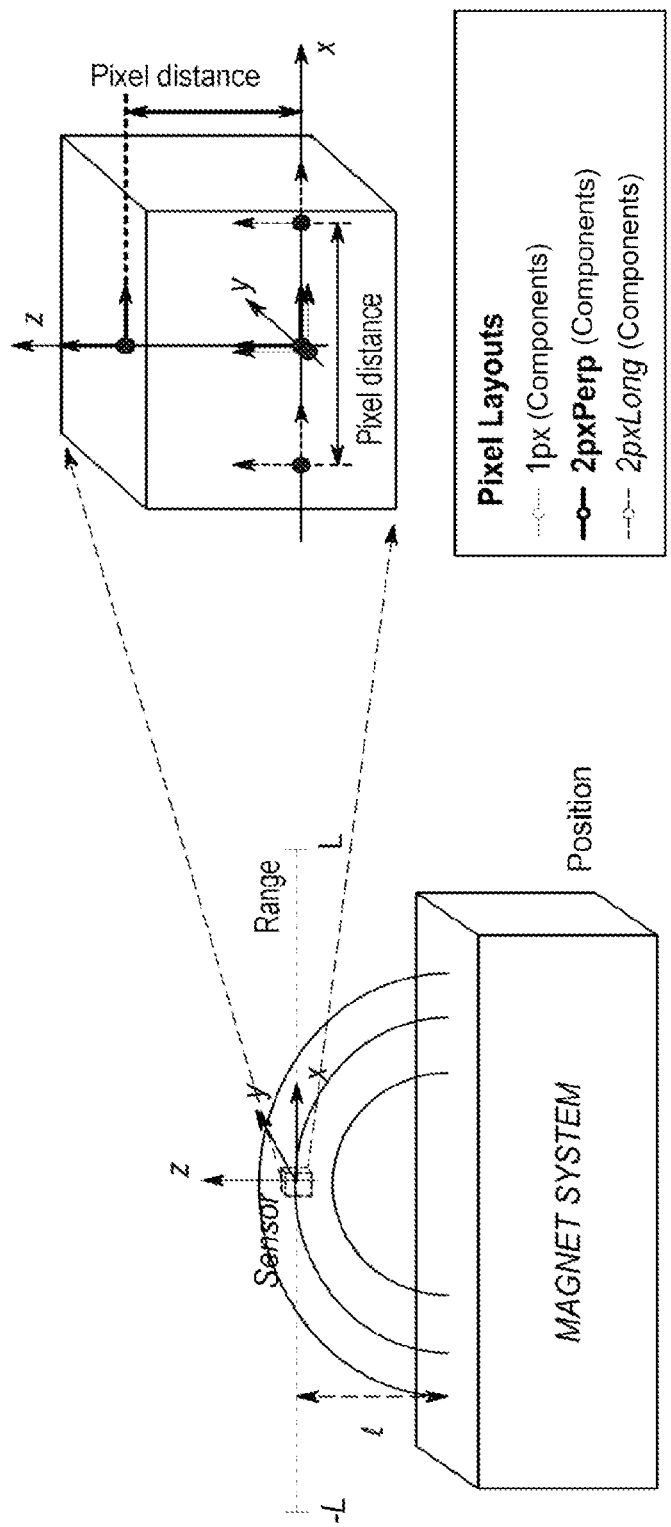
FIG. 5 shows an exemplary embodiment of a sensor system compared to other (conventional) sensor systems.
Figure 6A:
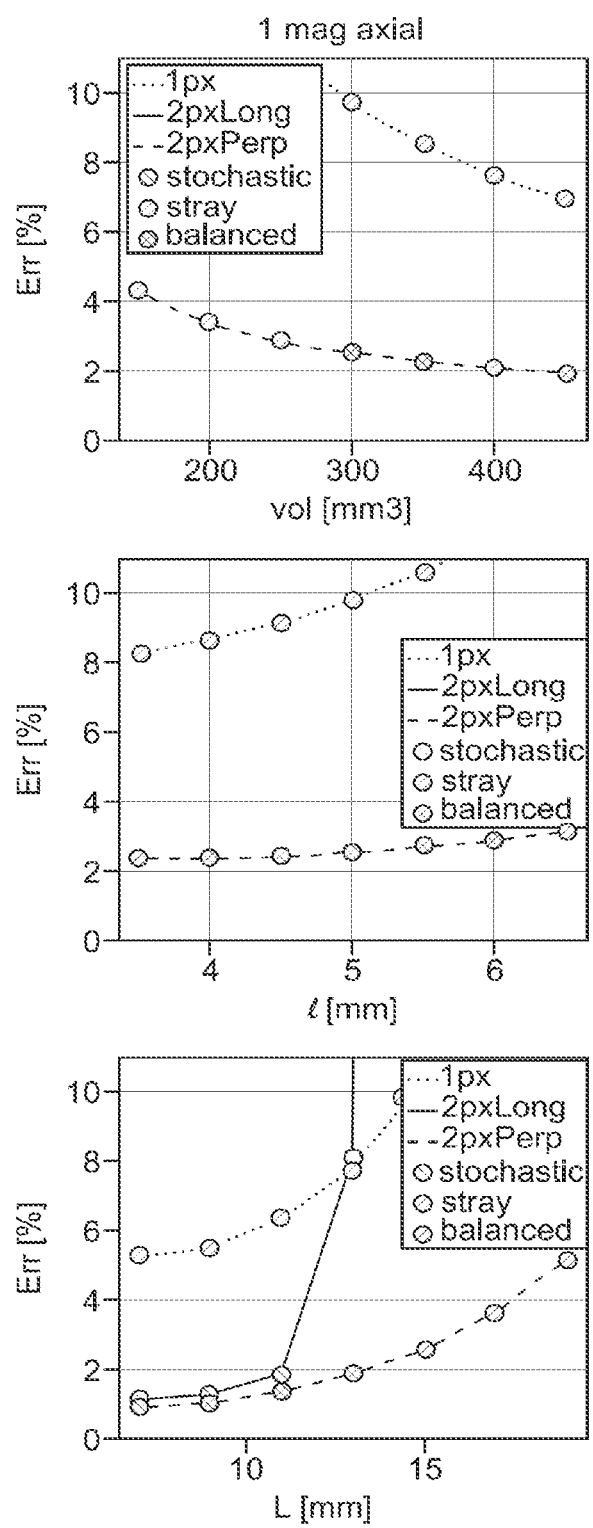
FIGS. 6a-6d show examples of position errors as a function of different system variables for different sensor systems.
Figure 6B:
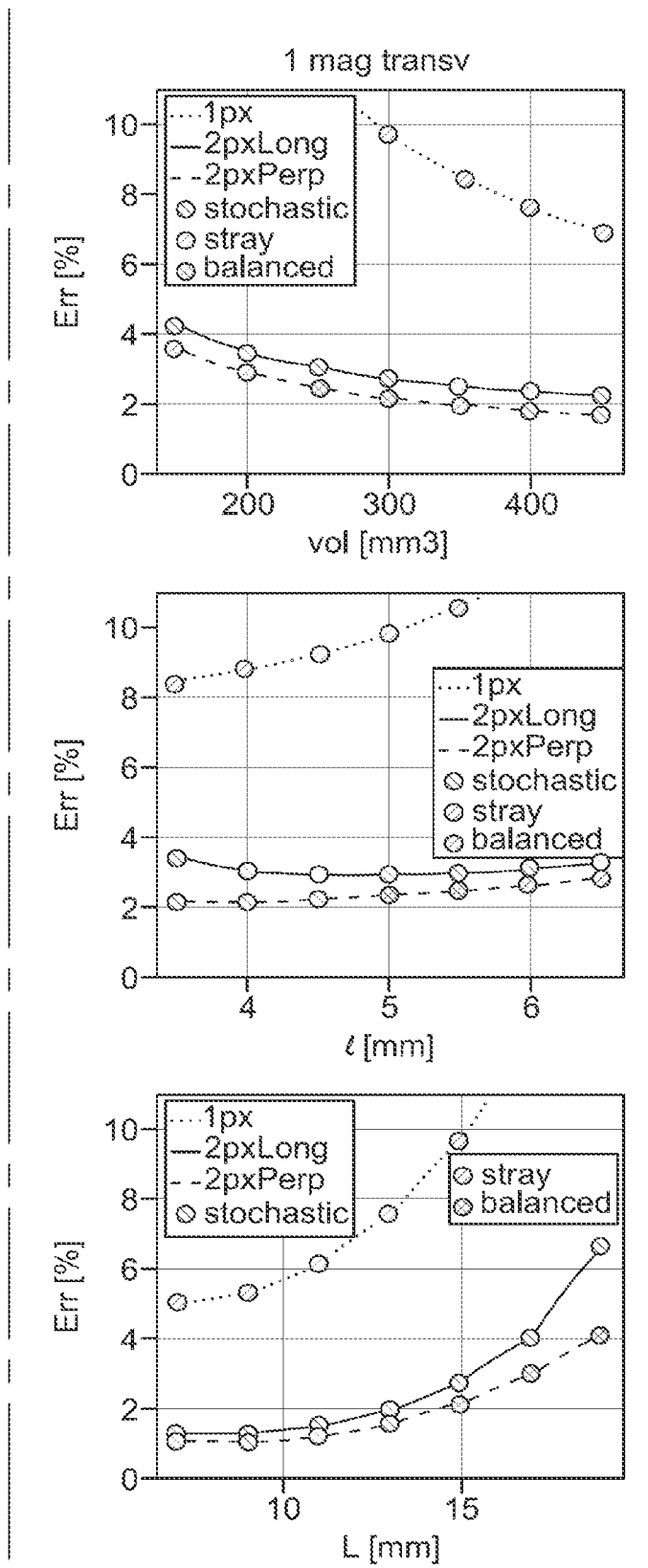
Figure 6C:
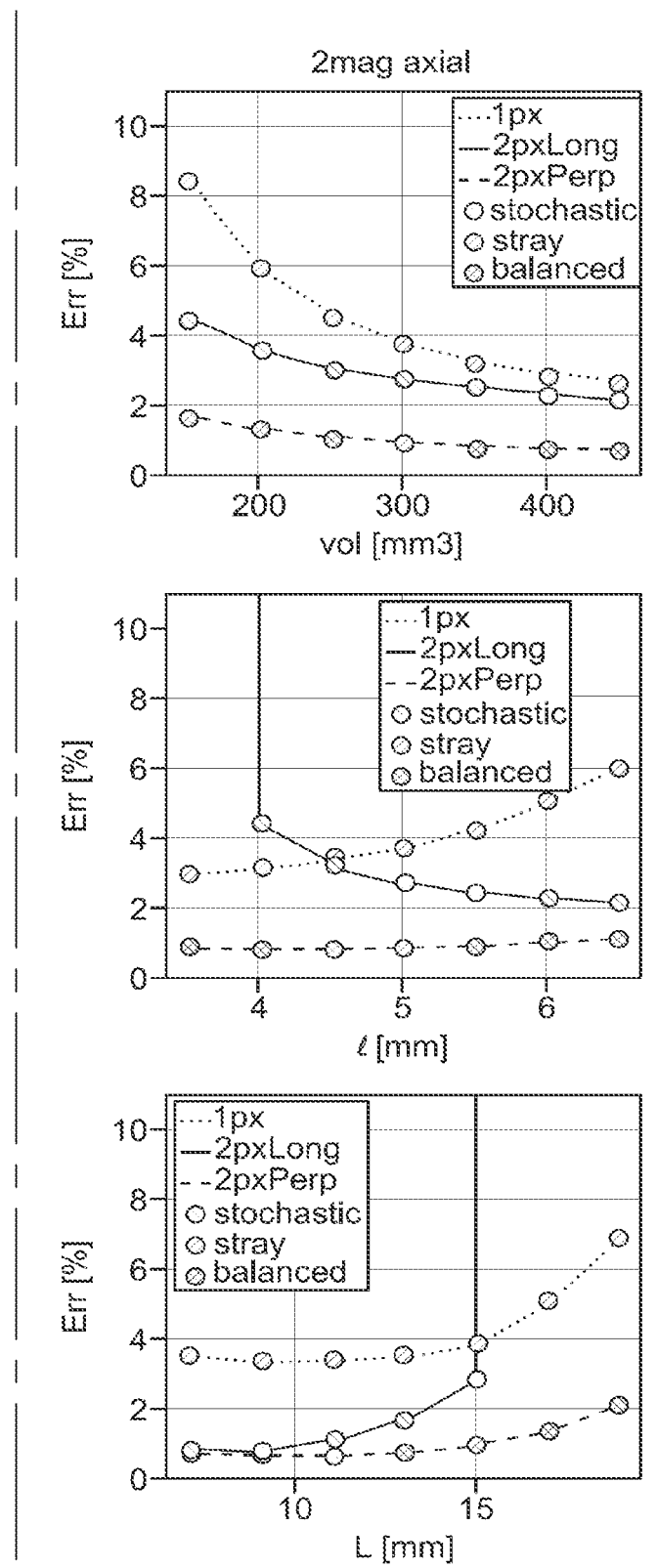
Figure 6D:
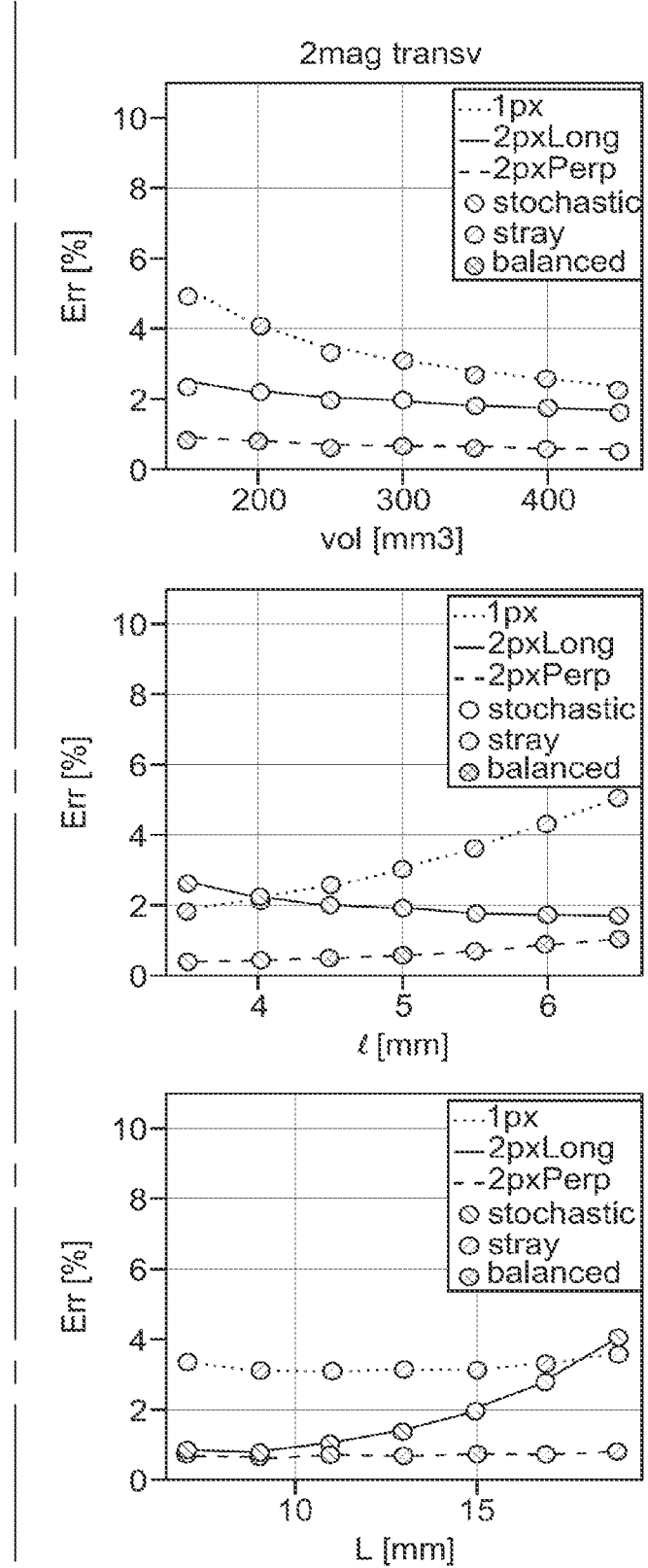

As explained below, the sensor system according to the proposed design can have better stability in terms of stray fields and stochastic sensor errors. In FIG. 5, the proposed (linear) sensor system (designated by 2pxPerp) is compared to other (conventional) sensor systems (designated by 1px and 2pxLong). The magnetic field sensors shown in FIG. 5 are 2D magnetic field sensors. The sensor system 2pxPerp differs from the other sensor systems illustrated in the number of magnetic field sensors (compared to the 1px sensor system) or in the arrangement of the magnetic field sensors relative to the magnet system (compared to the 2pxLong sensor system). Compared to the 2pxLong system, the magnetic field sensors of the 2pxPerp sensor system are arranged offset in the second direction (z direction) perpendicular to the first direction (motion direction, x direction). The magnetic field sensors are spaced apart by the pixel distance.

In FIGS. 6a-6d, position errors of the sensor systems shown in FIG. 5 (2pxPerp, 2PxLong and 1px) are shown as a function of different system variables and for different magnet systems. FIGS. 6a-6d are arranged from left to right. The results shown are based on simulations with the following parameters:

| | |
|---|---|
| Volume vol (of the magnet system) | 300 mm³ |
| Distance l (between magnet system and sensor) | 5 mm |
| (linear) range of movement | 30 mm |
| Δl (distance between magnetic field sensors) | 2 mm |
| Number of standard deviations σ (for evaluation of stochastic error) | 3 |
| Amplitude of the uncorrelated stochastic error (e.g., offset due to drift; 1 σ) | 0.04 mT |
| Amplitude of uncorrelated stochastic error (sensitivity; 1 σ) | 0.02 |
| Matching values of the sensor components (X1Y1, X1X2, X1Y2, Y1X2, Y1Y2, X2Y2) | 0.004; 0.006; 0.006; 0.006; 0.006; 0.004 |
| Amplitude of the stray field (Test Level V in ISO 262626) | 5 mT |
| Magnetic remanence | 1000 mT |

The simulations were carried out for magnet systems with one or two magnets in the axial and transverse arrangement (see FIG. 2). Percentage errors of the sensor systems considered were determined as a function of the volume of the magnet system, the distance between the magnet system and the sensor, and the (linear) range of movement. According to FIGS. 6a-6d, the 2pxPerp sensor system can show better stability with regard to stray fields and stochastic sensor errors. The simulations show that 2pxLong and 2pxPerp sensor systems behave in roughly the same way for large magnetic volumes (=higher complexity for the sensor system), large distances between the magnet system and the sensor and smaller ranges of movement. 2pxPerp sensor systems can deliver better results for smaller magnetic volumes, smaller distances, and larger ranges.

In general, a 2PxPerp sensor system can deliver up to 2-5 times better results than 2pxLong sensor systems and up to 5 times better results than 1Px sensor systems (with Test Level V in ISO11452-8).

By means of the proposed design for the arrangement of magnetic field sensors, e.g., according to the 2PxPerp layout (or a different offset arrangement perpendicular to the direction of motion), sensor systems can be produced with less effort or lower cost (e.g., due to smaller magnet volumes, smaller distances in the sensor system and/or larger ranges of movement). Furthermore, the 2px sensor system can create new opportunities for applications or systems that were previously unachievable or not fully achievable due to the previous arrangement or inadequate position determination.

To evaluate the stochastic measurement errors of a sensor system, correlations of the sensor signals can be analyzed (according to the matching values of the sensor components X1Y1, X1X2, . . . ). In general, a higher correlation (in terms of magnitude) between the errors of the output sensor signals (e.g., sensor signal ẞ$_x$ with the magnetic field component B$_x$ and sensor signal ẞ$_z$ with the magnetic field component B$_z$) can mean smaller errors in the relative position. In the following, a correlation between two components of a magnetic field sensor is termed the intra-pixel correlation and a correlation between two components of two different magnetic field sensors the inter-pixel correlation.

Compared to the 2pxLong sensor system, the 2pxPerp sensor system can benefit more from the matches between the intra-pixel correlations, whereas the accuracy of 2pxLong systems can depend predominantly on the inter-pixel correlations. This circumstance can be used to enable sensor systems to be implemented with two separate or spatially separated magnetic field sensors. For example, magnetic field sensors, the components of which have a good intra-pixel correlation, can be placed not only on a common chip but also on separate chips (in a common chip package or in different chip packages). A separate arrangement of magnetic field sensors in a sensor system can mean a lower inter-pixel correlation. Since the quality of a 2pxPerp sensor system can primarily depend on the intra-pixel correlation, a sensor system with equal or better accuracy can also be realized with separately implemented magnetic field sensors. By using separate implementation, sensor systems can be produced more easily, faster, or more cost-effectively.

The following text contains a comparison of intra- and inter-pixel correlations of 2pxPerp and 2PxLong sensor systems. For this purpose, consider the following correlation matrix E to describe the behavior of correlated random variables of the 4 components (two 2D sensor systems):

$$\Sigma = \begin{pmatrix} 1 & \sum_{12} & \sum_{13} & \sum_{14} \\ \sum_{21} & 1 & \sum_{23} & \sum_{24} \\ \sum_{31} & \sum_{32} & 1 & \sum_{34} \\ \sum_{41} & \sum_{42} & \sum_{43} & 1 \end{pmatrix}$$

The numbers 1 and 2 refer to the components of the first magnetic field sensor and the numbers 3 and 4 to the components of the second magnetic field sensor. As a result, the correlations $\Sigma_{12}$, $\Sigma_{34}$ (and $\Sigma_{21}$, $\Sigma_{43}$) describe the intra-pixel correlations. The remaining correlations (e.g., $\Sigma_{13}$, $\Sigma_{14}$ etc.) in the correlation matrix describe inter-pixel correlations.

Figure 7A:
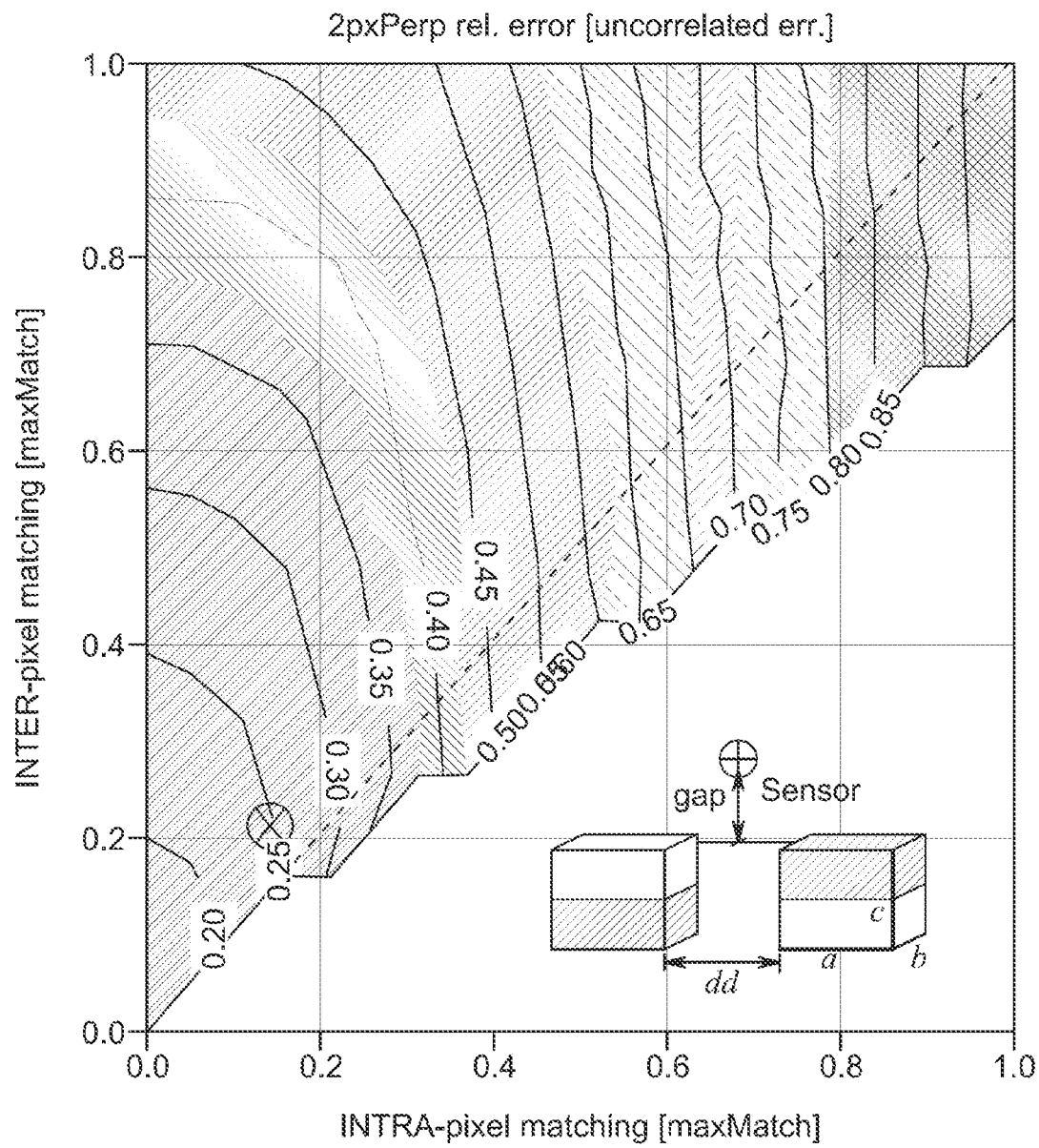
FIGS. 7a-7b shows examples of position errors as a function of intra- and inter-pixel matching values for a sensor system according to the proposed design and another sensor system.
Figure 7B:
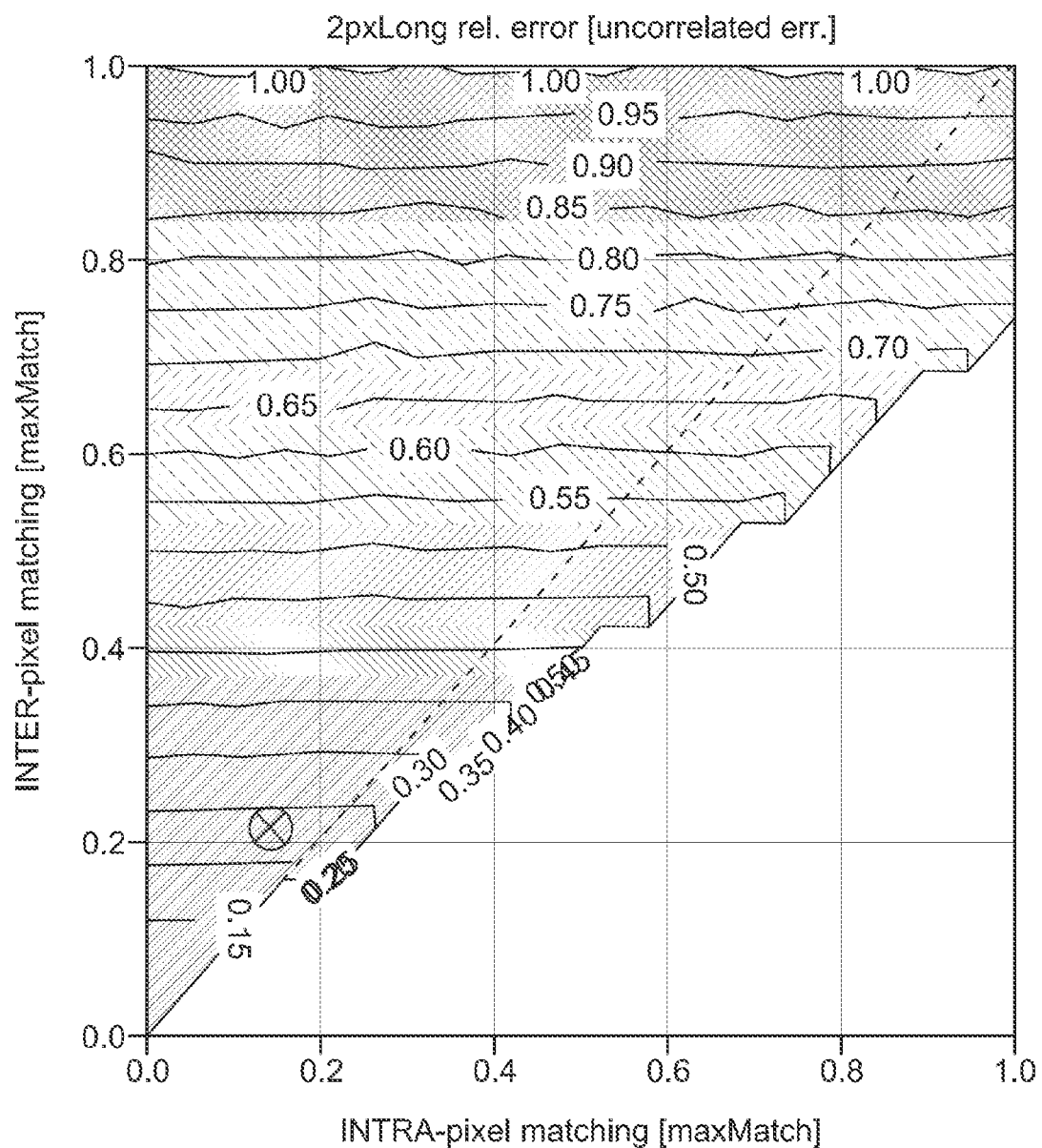

In FIGS. 7a-b, the relative errors of a 2pxPerp sensor system and a 2pxLong sensor system are compared in each case as a function of the intra- and inter-pixel matching values (for the correlations considered). mMax denotes a maximum possible matching value (=poor correlation) and mNom a typical 2-pixel matching. FIG. 7a shows that a smaller intra-pixel matching value (x-axis) can improve a 2pxPerp sensor system (smaller sensor system error). On the other hand, the error of the 2pxLong sensor system for different intra-pixel matching values remains essentially unchanged (FIG. 7b). For a suitable intra-pixel matching value, a 2pxPerp sensor system could therefore also provide good results for a separate (more cost-effective) implementation of magnetic field sensors.

As shown in the example of FIG. 7b, the 2pxLong sensor system with $m_{INTRA}=2\%_{5\sigma}$, $m_{INTER}=3\%_{5\sigma}$ has a relative error of approximately 0.35. According to FIG. 7a, a sensor system of the same quality with lesser requirements ($m_{INTRA}=2\%_{5\sigma}$, $m_{INTER}=6\%_{5\sigma}$) could be implemented by means of the 2pxPerp arrangement. For a completely uncorrelated inter-pixel matching ($m_{INTER}=100\%_{5\sigma}$), the 2pxPerp sensor system could provide a better accuracy (e.g., factor of 2) by optimizing the intra-pixel matching alone.

In comparison to other sensor systems, sensor systems according to the proposed design could make better use of intra-pixel matching values. For example, 2pxPerp sensor systems could consider only two matching values instead of 6 matching values. This could, for example, reduce or better compensate for stochastic errors (such as drifts). 2pxPerp sensor systems could have better properties in terms of the range of movement, the volume of the magnet system, the distance between the magnet system and the sensor, and the inter-pixel distance.

In comparison to sensor systems with an offset arrangement of less than or greater than 90° (e.g., 60° or 120°, see description for FIG. 1a), a 2pxPerp sensor system (with 90° arrangement) can better benefit from the intra-pixel correlations and thus have better stability.

Figure 7C:
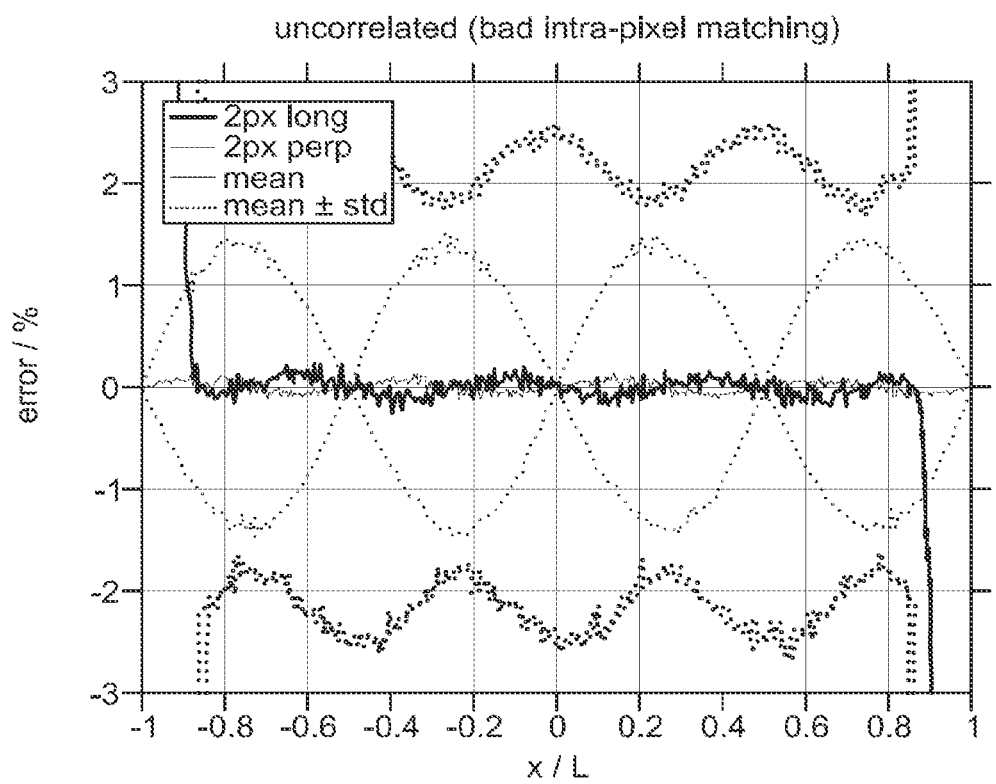
FIGS. 7c-7d shows examples of position errors as a function of relative positions for a sensor system according to the proposed design and another sensor system for random and correlated sensor errors.

FIG. 7c shows a 2px-Perp sensor system according to the proposed design and a conventional 2px-Long sensor system with random sensitivity errors (sensor errors without correlation). It can be seen that the error for 2px-Perp sensor systems may have smaller errors over a larger range. The difference in the errors is particularly noticeable for large relative positions (x/L>0.8 and x/L<−0.8).

Figure 7D:
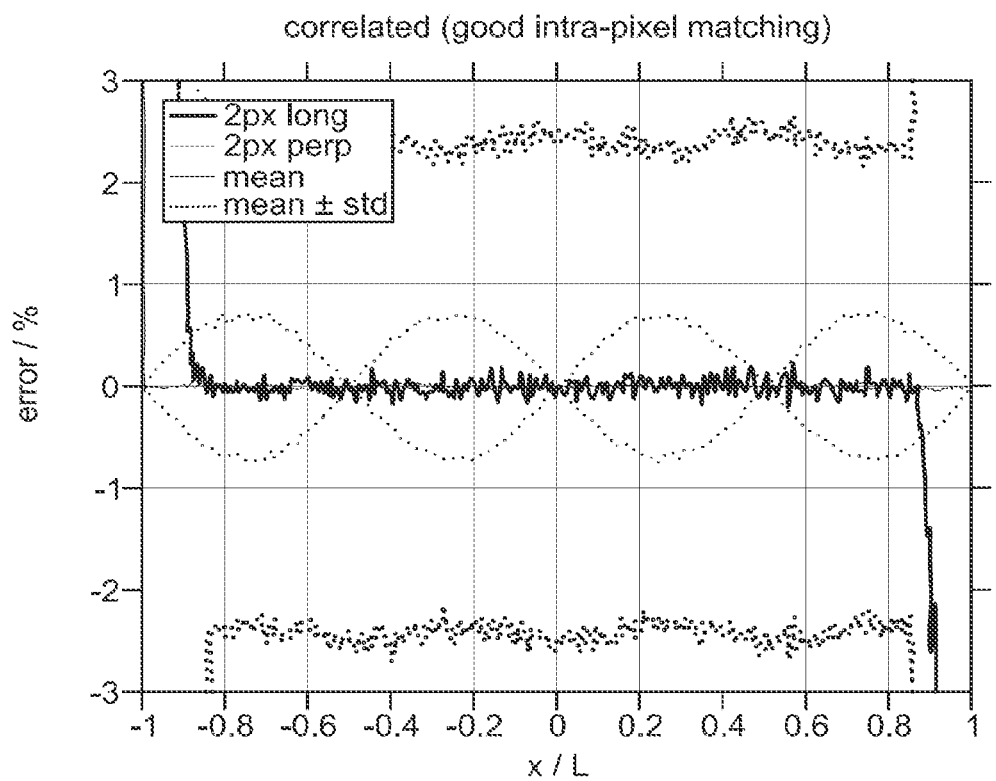

FIG. 7d shows the two sensor systems for correlated sensitivity errors. It is noticeable that the error is barely visible for 2px-Perp sensor systems, while the error is still visible for 2px-Long sensor systems. Also in this case, the difference in the errors is particularly noticeable for large relative positions (x/L>0.8 and x/L<−0.8).

The difference in the errors for the two sensor systems considered could be due to the phase relationship between the sensor signals, as explained in more detail below.

Figure 7E:
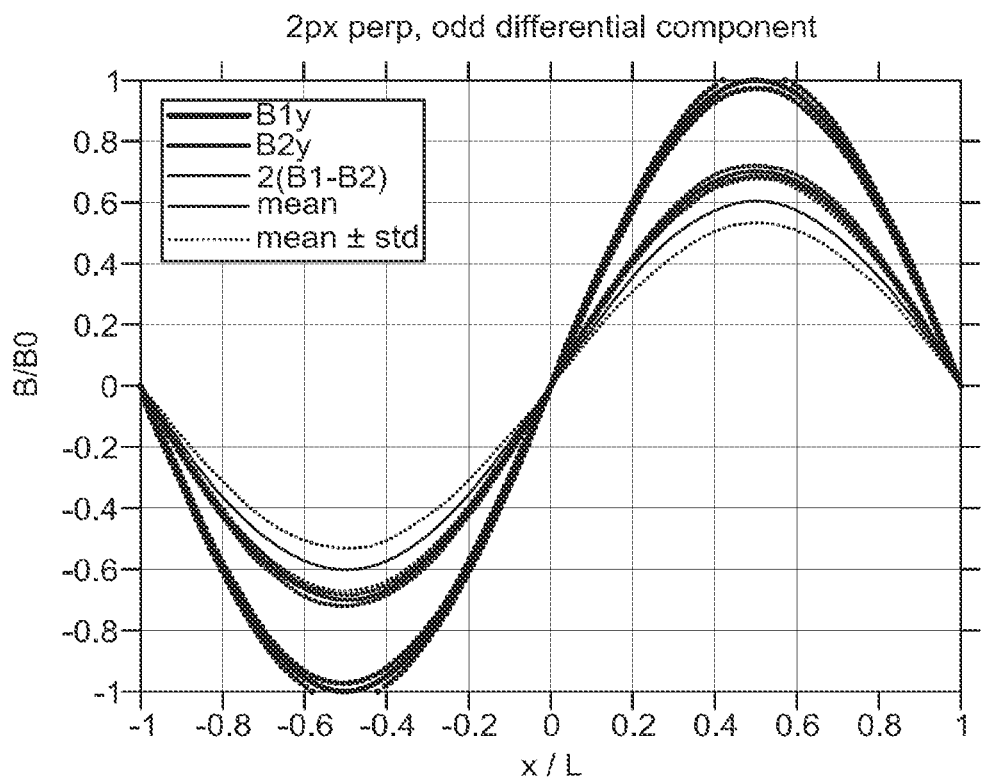
FIGS. 7e-7h shows examples of sensor signals and differential signals as a function of relative positions for a sensor system according to the proposed design and another sensor system and for different magnetic field components.
Figure 7F:
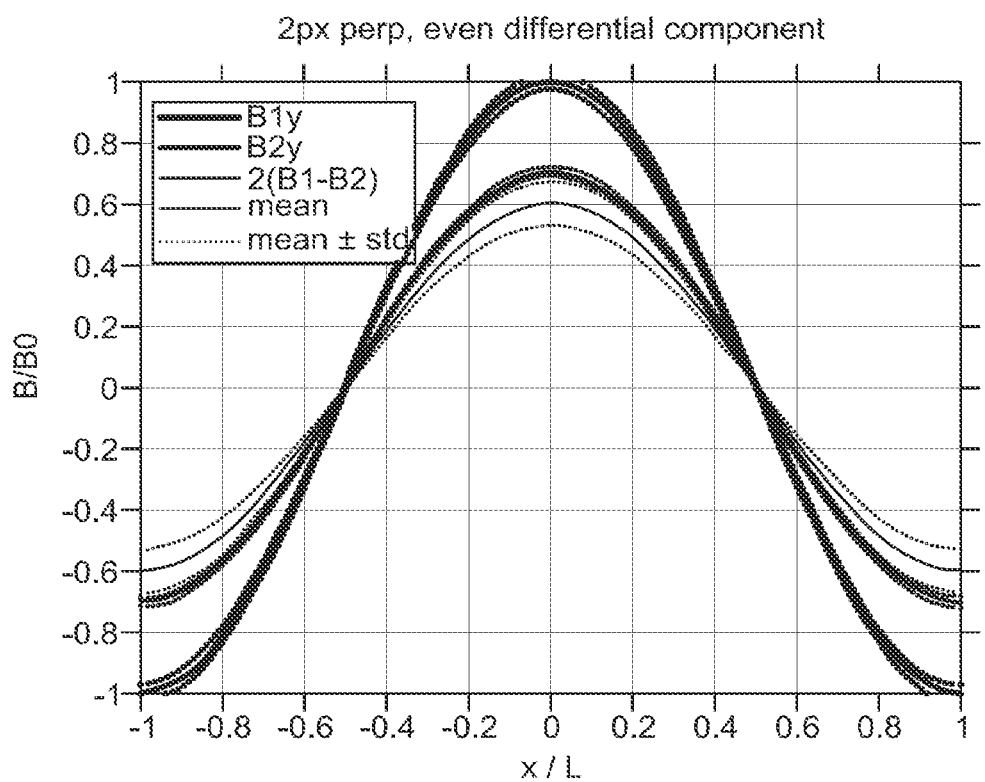

FIGS. 7e-f show examples of signals from magnetic field sensors for 2px-Perp sensor systems according to the proposed design and the resulting differential signal derived from them as a function of the relative position and for two components (x and y) of the magnetic field in each case. It can be seen that for 2px-Perp sensor systems the signals of the magnetic field sensors are in phase and the signals differ in their amplitudes (due to the different distances from the magnet system). Accordingly, the differential signal is also in phase with the signals from the magnetic field sensors. The signals of the magnetic field sensors and the differential signal have common points with zero crossings. The differential signals can be used, for example, to determine the relative position of the magnetic field sensors.

Figure 7G:
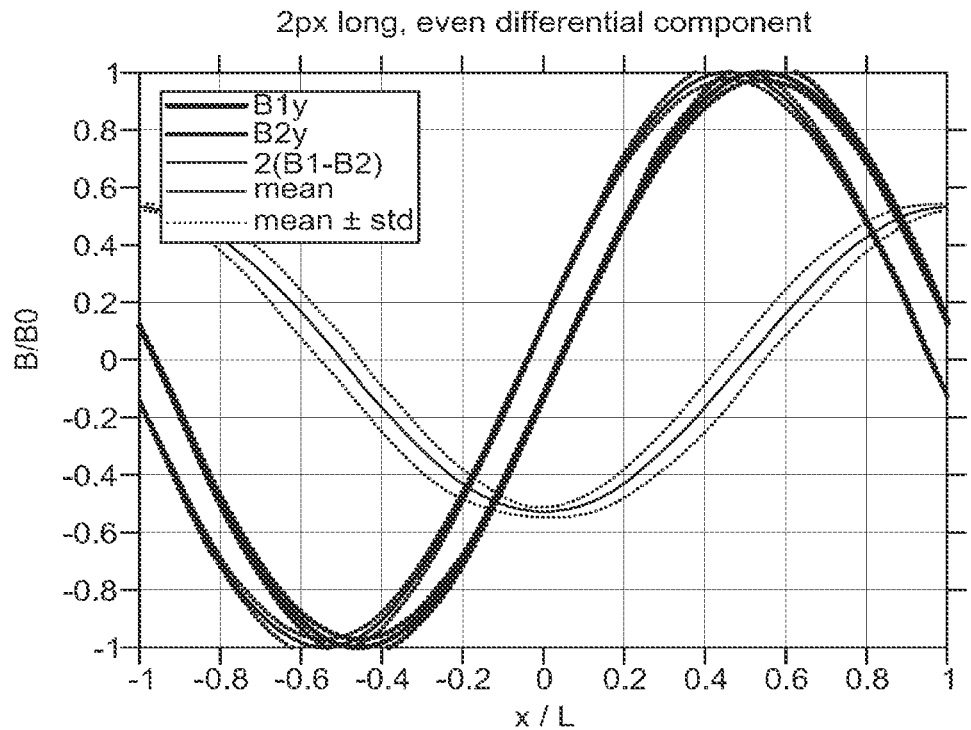
Figure 7H:
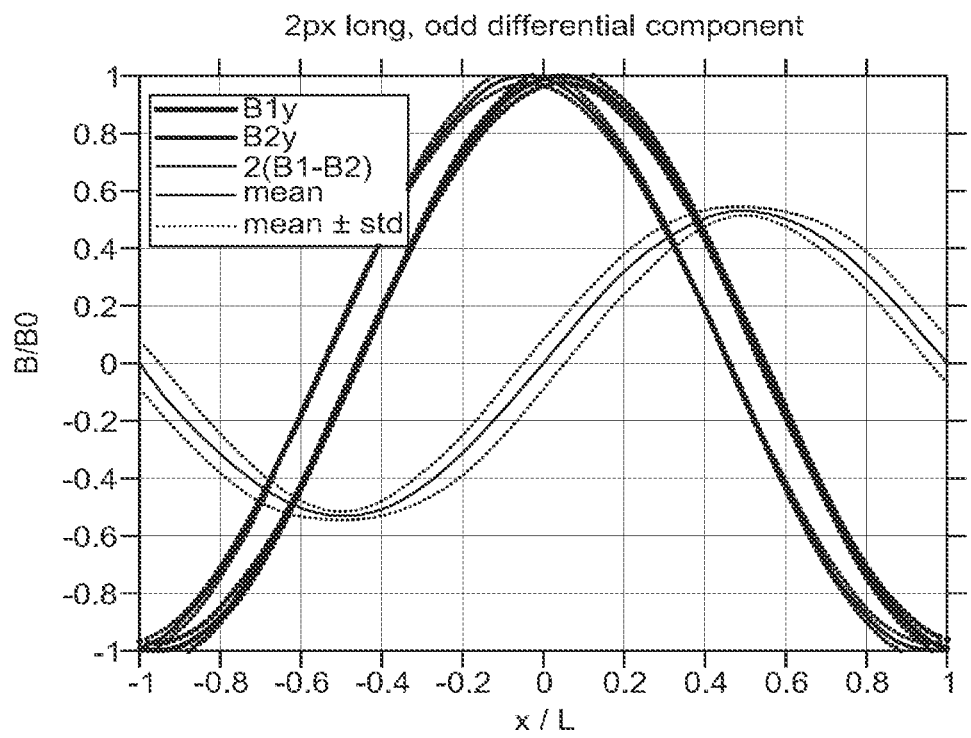

FIGS. 7g-7h (bottom) show examples of signals from magnetic field sensors for conventional 2px-Long sensor systems and the resulting differential signal derived from them as a function of the relative position and for two components (x and y) of the magnetic field in each case. As expected, the signals of the magnetic field sensors in the 2px-Long sensor system are phase-shifted. Accordingly, the differential signal is also phase-shifted with respect to the signals of the magnetic field sensors. The signals of the magnetic field sensors and the differential signals have common points with zero crossings.

In FIGS. 7e-7h, the dashed lines show the standard deviation for each signal. As the standard deviation for higher signals (in terms of magnitude) increases, the standard deviation for higher differential signals (in terms of magnitude) also increases. Since the signals in 2px-Perp sensor systems are in phase, the error for the differential signal can be lower than in 2px-Long sensor systems in a larger range (e.g., in the region of the zero crossings). In the examples shown in FIGS. 7g-7h, the differential signals of the 2px-Long sensor systems show a larger error over a larger range (e.g., in the region of the maxima).

Compared to conventional sensor systems (e.g., 2px-Long sensor systems), sensor systems according to the proposed design (e.g., sensor systems 100, 1000 of FIG. 1a-b) can output sensor signals with or without a smaller phase shift. With a sensor system that outputs sensor signals with or without a small phase shift, a relative position could be determined with a smaller error.

In connection with the FIGS. 8a-c, exemplary embodiments of sensor systems in conjunction with a magnetic field with and without a superimposed external magnetic field are described below. The sensor systems in FIGS. 8a-c can be implemented in the same or a similar way to the sensor systems described in connection with FIGS. 1a, 2, 3 or 4.

Figure 8A:
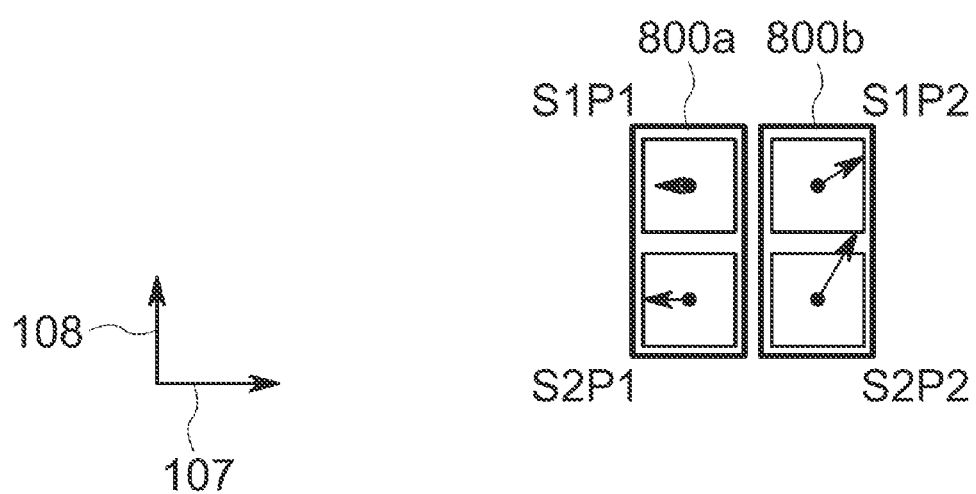
FIG. 8a shows an exemplary embodiment of a sensor system in two different positions.

FIG. 8a shows an exemplary embodiment of a sensor system (e.g., IC chip) in a first position P1 (sensor system 800a) and a second position P2 (sensor system 800b). The sensor system 800a-b comprises a first and second magnetic field sensor. The magnetic field sensors of the sensor system in the first and second positions are referenced with the designations S1P1 (first magnetic field sensor of the sensor system in position P1), S2P1 (second magnetic field sensor of the sensor system in position P1), S1P2 (first magnetic field sensor of the sensor system in position P2), S2P2 (second magnetic field sensor of the sensor system in position P2). According to the example in FIG. 8a, the magnetic field sensors are 2D sensors which can measure an applied magnetic field in the first direction 107 (e.g., x direction) and the second direction 108 (e.g., y direction). The magnetic field sensors of different positions can determine the x and y field components and/or the angle of a magnetic field at the sensor position and optionally also the vector length. According to the example, the vectors of the magnetic field sensors shown in FIG. 8a with the vector orientation (or direction, or angle) and the vector length describe an applied magnetic field (not shown in FIG. 8a) which is measured by the respective magnetic field sensors S1P1, S2P1, S1P2, S2P2.

Figure 8B:
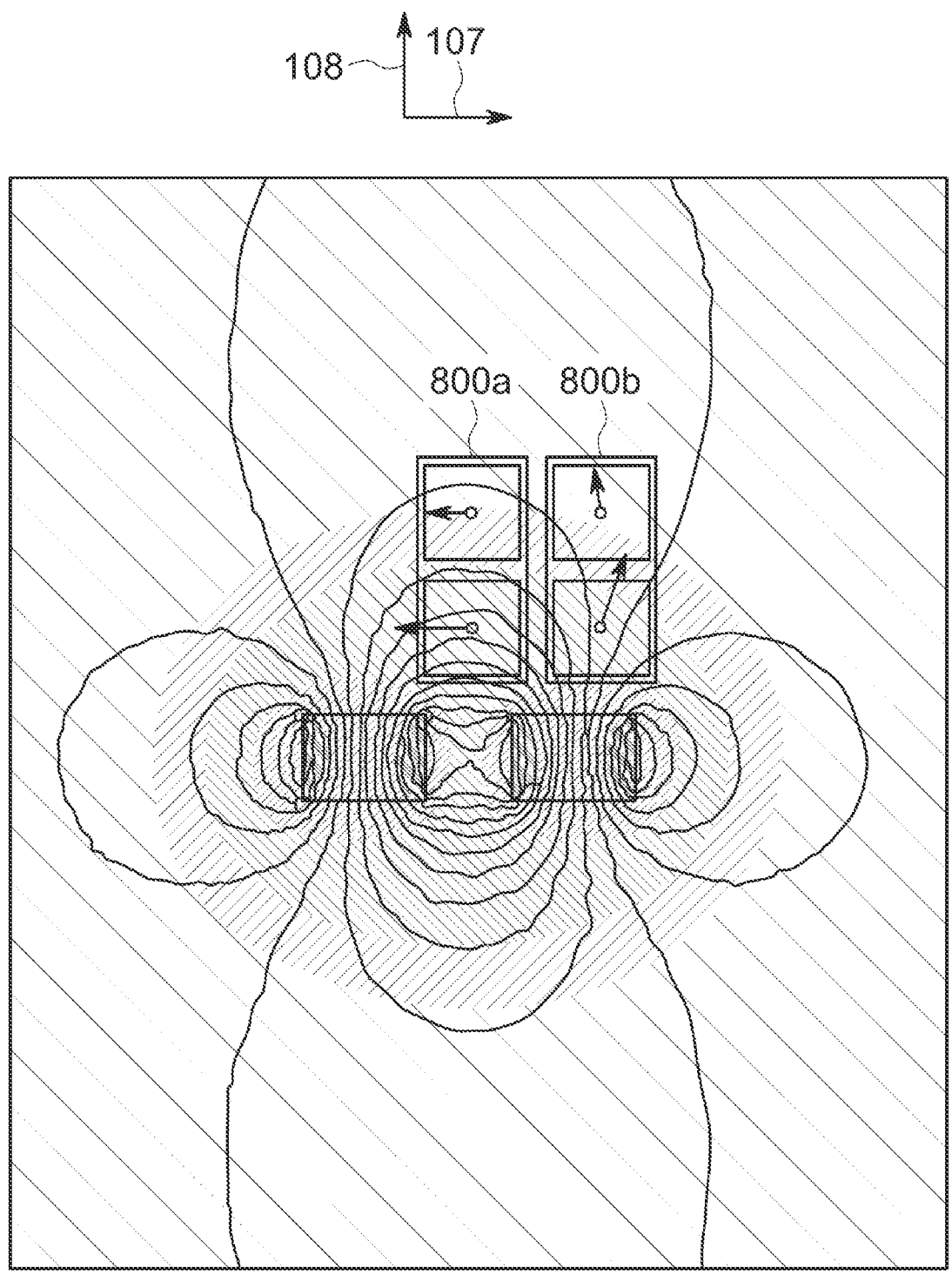
FIG. 8b shows an exemplary embodiment of a sensor system in a magnetic field generated by a magnet system (without a superimposed external magnetic field)

FIG. 8b shows the sensor system 800a-b described in connection with FIG. 8a in a magnetic field generated by a magnet system. FIG. 8c shows the sensor system 800a-b described in connection with FIG. 8a in a magnetic field that is generated by a magnet system and superimposed with an external (homogeneous) magnetic field (e.g., homogeneous stray field or interference field in the x direction).

As shown in the example of FIG. 8b, both magnetic field sensors S1P1, S2P1 in position P1 measure an angle of 180° relative to the first direction 107 (x direction). The vectors of the magnetic field sensors S1P1, S2P1 have different vector lengths, which is due to different distances from the magnetic field sensors to the magnet system. In position P2, the first magnetic field sensor S1P2 shows small but opposite deviations in the second direction 108 (90° relative to the x direction; y direction) compared to the second magnetic field sensor S2P2. Due to the different distances at which the magnetic field sensors are located, the vector lengths for each magnetic field sensor S1P2, S2P2 are different.

Figure 8C:
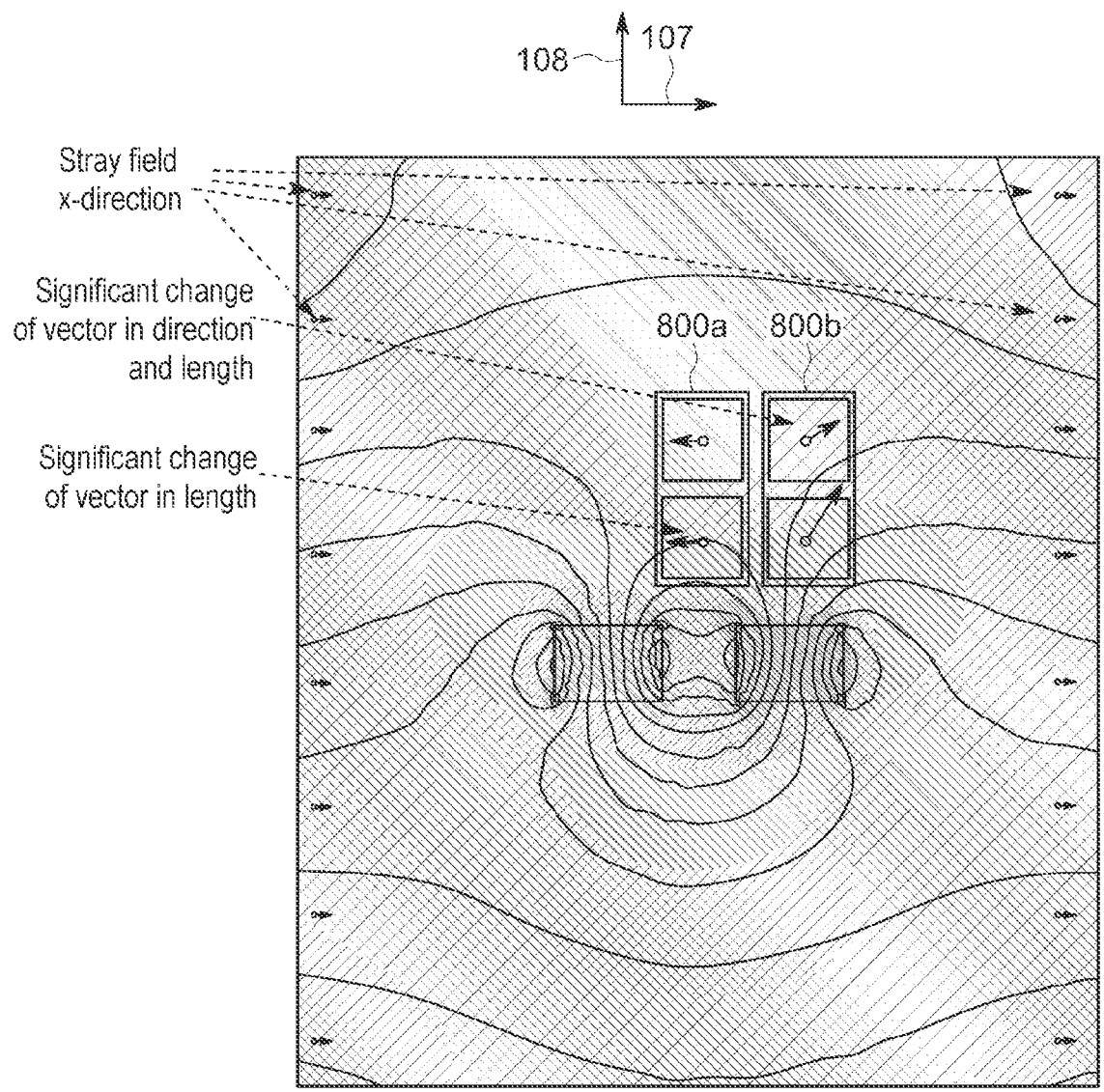
FIG. 8c shows an exemplary embodiment of a sensor system in a magnetic field generated by a magnet system with a superimposed external magnetic field.

As shown in the example of FIG. 8c, for a superimposed stray field in the x direction, the two magnetic field sensors S1P1, S2P1 in position P1 continue to measure an angle of 180°. For the first magnetic field sensor S1P1, the relative vector length can change significantly due to the external magnetic field. For the second magnetic field sensor S2P1, the relative vector length can change only slightly (or remain essentially the same), since the second magnetic field sensor S2P1 can benefit from the strong differential useful signal of the magnet system (deviation between the magnetic field of the magnet system and the external magnetic field). In position P2, relatively little change can occur for the second magnetic field sensor S2P2, while the first magnetic field sensor S1P2 can be influenced more strongly by the stray field. The angle and the vector length can change significantly for the first magnetic field sensor S1P2.

The drawings for the different positions of sensor systems 800*a-b* show that the second magnetic field sensor (S2P1, S2P2), which is arranged closer to the magnet system compared to the first magnetic field sensor (S1P1, S1P2), can be influenced less in terms of angle and the relative vector length by the stray field in the x direction. The first magnetic field sensor (S1P1, S1P2), which is further away from the magnet system compared to the second magnetic field sensor (S2P1, S2P2), can be more susceptible to external interfering magnetic fields. In principle, the relative position can still be determined using the information from the two magnetic field sensors S1P1 and S2P1. This position can be determined, for example, by approximative function equations, by look-up tables, or by machine learning (AI, deep learning, neural networks) algorithms.

For the position determination using machine learning algorithms, for example, the signals measured by the magnetic field sensors can be calculated as a function of the relative position and for different interfering magnetic fields. Suitable techniques for this purpose are finite-element (FE) simulations or analytical approximation formulas. This data is used to train the algorithm (supervised learning). The trained algorithm can then be used efficiently in the application to determine the relative position from a set of magnetic field sensor signals.

Based on the foregoing considerations of the measured magnetic field components by means of the magnetic field sensors (and the associated signals), signal processing can be carried out in such a way that the relative position can be determined. In the following description, further details of the signal processing circuit 110 that was described in connection with FIG. 1*a-b* are described by way of examples.

The signal processing circuit 110 can use the first signal from the first magnetic field sensor and the second signal from the second magnetic field sensor to determine the relative position.

According to an example, the signal processing circuit 110 can be configured to determine a difference between the first signal and the second signal (differential measurement). With two magnetic field sensors, the sensor system can detect, for example, two different magnetic field components $B_\parallel$ and $B_\perp$ for each one and generate the signals $\beta_\parallel$ and $\beta_\perp$ accordingly. For example, an output of the sensor system is given by $\zeta = a\tan_2(\beta_\parallel, \beta_\perp)$ with $\beta_\parallel = \beta(B_\parallel)$ and $\beta_\perp = \beta(B_\perp)$. In the following, this signal processing method can be generally referred to as inverse approximation.

According to another example, the signal processing circuit can use the arc tangent function for one magnetic field sensor in each case and thus determine a first angle and a second angle (see explanations for FIG. 3). The relative position can again be determined from the difference of the angles.

According to another example, the signal processing 110 can be configured to determine a ratio between the first signal and the second signal. The first and second signals may have different amplitudes due to the offset arrangement perpendicular to the direction of motion. By determining the ratio, a relative relationship between the sensor signals can be determined and used for determining the relative position.

The signal processing circuit can use methods, such as algorithms for suppressing, compensating, or reducing errors caused by an external magnetic field or the magnetic field sensors, for example, for a more accurate determination of the relative position. The following design for the signal processing can be generally referred to as a numerical model or forward formulation.

According to an example, the signal processing circuit 110 can be configured to determine the relative position numerically, by (specifically) assuming errors at least with respect to a superimposed external magnetic field or a magnetic field sensor.

This approach can be motivated as follows:

Without an external interference magnetic field, a certain valid parameter set (at a certain distance from the magnetic field sensors to the magnet system) can exist, e.g., with angles (or x and y components) of the first and second magnetic field sensor with respect to the magnet system. This relationship can vary with the distance. For larger distances from the magnet system (e.g., greater than 5 mm), the position can be determined e.g., by an absolute vector length measurement of the first and/or second magnetic field sensor. For smaller distances from the magnet system (e.g., less than 5 mm), the position can be determined e.g., by (absolute) measurement of the ratio of the vector lengths of the first magnetic field sensor to the second magnetic field sensor.

Assuming that in the absence of interference fields, there can be only one valid parameter set (with e.g., angle relationships, vector-length relationships or x and y components), an algorithm can vary the x component for the first magnetic field sensor and simultaneously the second magnetic field sensor, for example incrementally, until a valid parameter set (e.g., with sufficient matching according to a threshold value) is found. This incremental approximation to a match between parameter sets can be carried out, for example, by incrementally adding a constant (the step size) to the x component. The added value can (in total) correspond, for example, to the stray field in the x direction. This procedure can also be performed for the y direction.

For example, the signal processing circuit can be implemented as follows to determine (numerically) the relative position according to the forward formulation:

The signal processing circuit can be configured to minimize a function based on a deviation between a theoretical state of the magnetic field and a magnetic field determined by the first and second signals, in order to determine the relative position. The signal processing circuit can also be configured to minimize the function based on an expected size of the errors, at least with respect to the external magnetic field or the magnetic field sensor. A theoretical state $\vec{B}_{Theorie}(x)$ of the magnetic field can be described by a mathematical model (e.g., as a function of the relative position x). A magnetic field $\vec{B}_{Real}$ can be determined by the first and second signals of the magnetic field sensors.

The following shows examples of details of the forward formulation for a sensor system with two 2D magnetic field sensors (4 components) in order to determine the relative position x numerically:

1. Assumption of (independent) sensor errors (e.g., sensor noise; ε) and strength of a superimposed (dependent) stray field ($B_S$):

$$X_1 = B_{mx}(z_1) + \varepsilon_{x1} + B_{sx}$$

$$X_2 = B_{mx}(z_2) + \varepsilon_{x2} + B_{sx}$$

$$Z_1 = B_{mz}(Z_1) + \varepsilon_{z1} + B_{sz}$$

$$Z_2 = B_{mz}(z_2) + \varepsilon_{z2} + B_{sz}$$

with $\vec{B}_{Real} = (X_1 Z_1 X_2 Z_2)^T$ and $\vec{B}_{Theorie} = \vec{f}(x)$ 2. Determining the covariance matrix:

$$\Omega = \begin{pmatrix} \varepsilon_x^2 + B_s^2 & & B_s^2 & \\ & \varepsilon_z^2 + B_s^2 & & B_s^2 \\ B_s^2 & & \varepsilon_x^2 + B_s^2 & \\ & B_s^2 & & \varepsilon_z^2 + B_s^2 \end{pmatrix}$$

3. Numerically solving the equation $$x_{opt} = \underset{x}{\mathrm{argmin}}\, (\vec{db}^T(x) \cdot \Omega^{-1} \cdot \vec{db}(x))$$

with $\vec{db}(x) = \vec{B}_{Theorie}(x) - \vec{B}_{Real}$.

In comparison to inverse approximation (with x~φ=f(dZ/dX)), in the forward formulation the relative position can be determined numerically with the approach (X1, Z1, X2, Z2)=f(x). For example, using the method of (non-linear) generalized least squares (GLS), assuming specific sensor errors ($\varepsilon_x$, $\varepsilon_z$) and/or the strength of the stray fields ($B_S$), the relative position ($x_{opt}$) can be determined more accurately or with a smaller error.

In FIGS. 9a-b, 10a-b and 11a-b, the forward formulation and the inverse approximation are compared with respect to the position errors. The different curves refer to different directions of a superimposed external magnetic field (0.0°-90.0°).

Figure 9A:
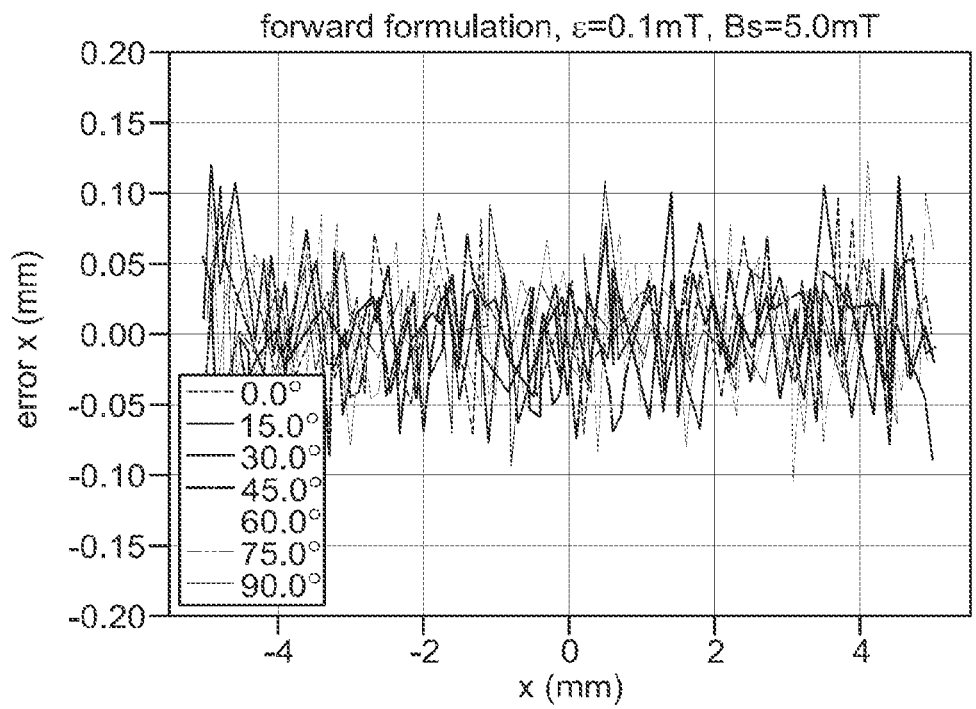
FIGS. 9a-9b shows examples of position errors based on various signal evaluations with a sensor error which is smaller than an error due to a stray field.
Figure 9B:
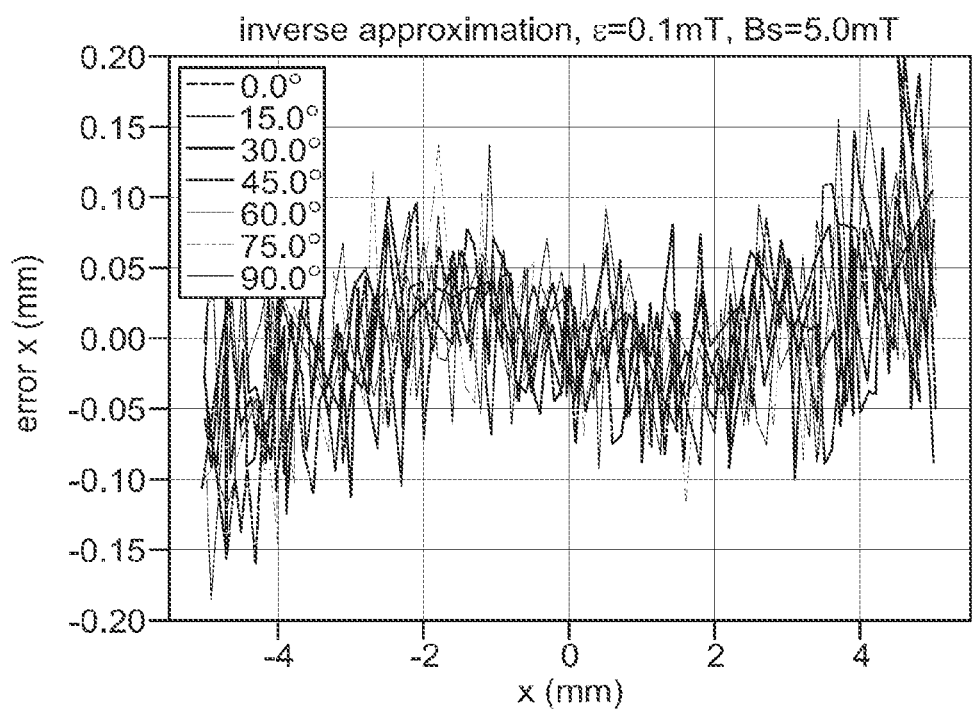
Figure 10A:
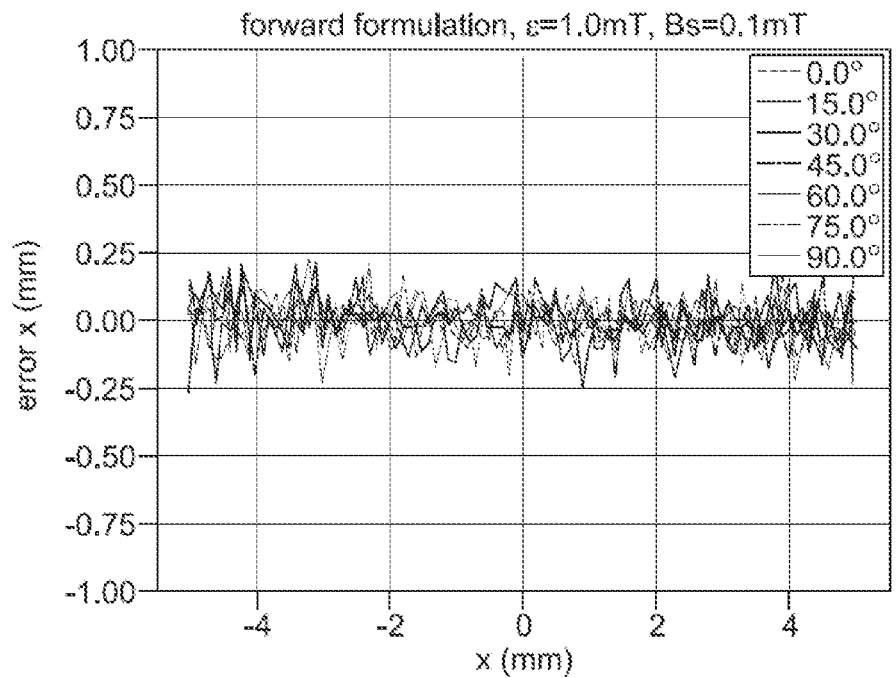
FIGS. 10a-10b shows examples of position errors based on various signal evaluations with a sensor error which is larger than an error due to a stray field.
Figure 10B:
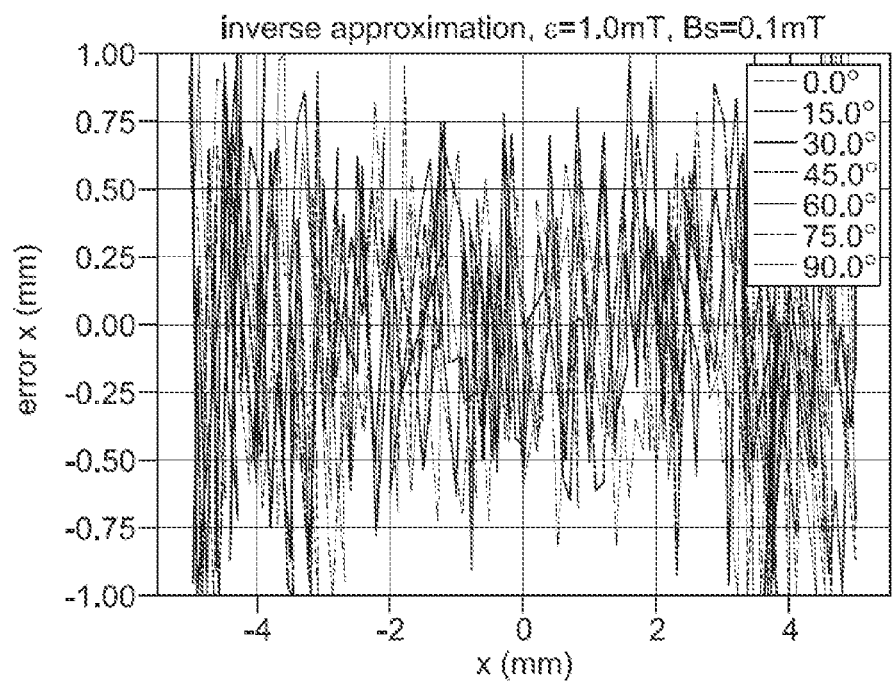

In FIGS. 9a-9b, the relative position errors for $B_S > \varepsilon_x$, $\varepsilon_z$ are shown. In comparison to inverse approximation, when using the forward formulation the systematic position error (i.e. position error as a function of the position x) for the observed movement range of −4 mm<x<4 mm can essentially vanish. The comparison shows that the sensor system can be less susceptible to external stray fields. The effect that position errors can be smaller using the forward formulation can also occur (and more noticeably) in the case of larger sensor errors ($B_S < \varepsilon_x$, $\varepsilon_z$: see FIGS. 10a-10b) and in the case of (approximately) equal-sized errors with respect to the sensor and stray field ($B_S \sim \varepsilon_x$, $\varepsilon_z$: see FIGS. 11a-11b). As a result, a sensor system can more accurately determine a relative position by using the forward formulation.

For example, the signal processing circuit can be configured to determine the relative position by using a machine learning algorithm. By means of machine learning (e.g., neural networks, deep learning) or artificial intelligence methods in general, interfering parameters can be determined more efficiently (e.g., by supervised learning) and better compensated for in the calculation of the relative position. Artificial intelligence can be used, for example, to incorporate interfering fields from experiments or simulations. The position determination can be made more effective by using artificial intelligence methods (lower memory requirements, less complex calculations, flexible adaptation to different arrangements and environmental conditions).

According to another example, lookup tables can be used to determine the relative position.

The forward formulation is not limited to the above embodiments, but can comprise, e.g., additional calculations or additional interfering parameters to determine the relative position numerically using initial assumptions for the errors (offsets, stochastic or non-systematic errors). In addition, the signal processing circuit can use other methods, such as a function other than the argmin function, to minimize a function that is based on a deviation between a theoretical state of the magnetic field and a magnetic field determined by the first and second signals. According to one example, the forward formulation could be implemented in a (signal processing) circuit of any type of sensor system (e.g., 2PxLong sensor system) to be able to determine the relative position more precisely.

In another example, the magnetic field sensors can be operated with at least one common supply system according to a multiplex method. For example, the magnetic field sensors can be operated via a common bias current and/or via a common analog-to-digital converter (ADC) in the multiplexing process. This operating mode can improve intra- and/or inter-matching, for example, and enable a more accurate position determination or a position determination with a smaller error.

Figure 11A:
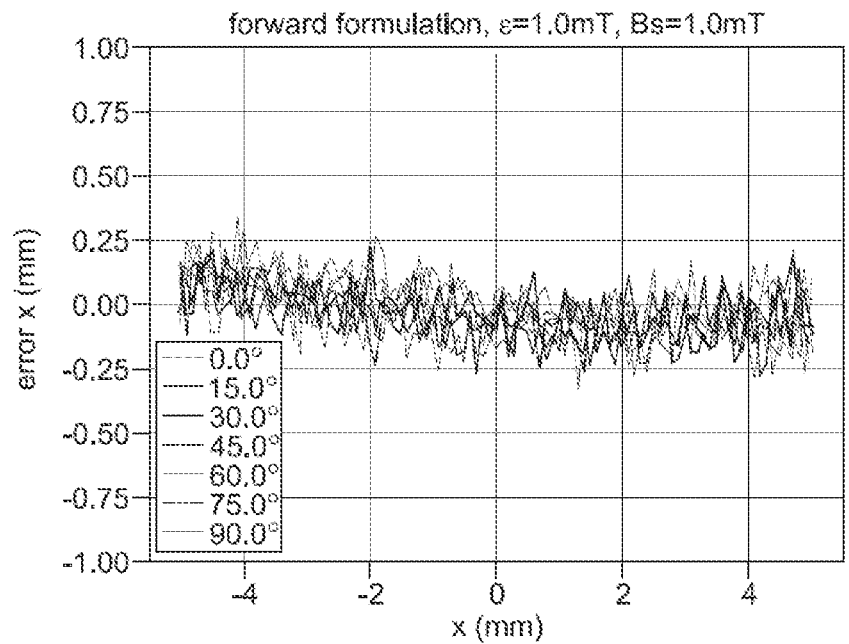
FIGS. 11a-11b shows examples of position errors based on different signal evaluations with the same sensor error and error due to a stray field.
Figure 11B:
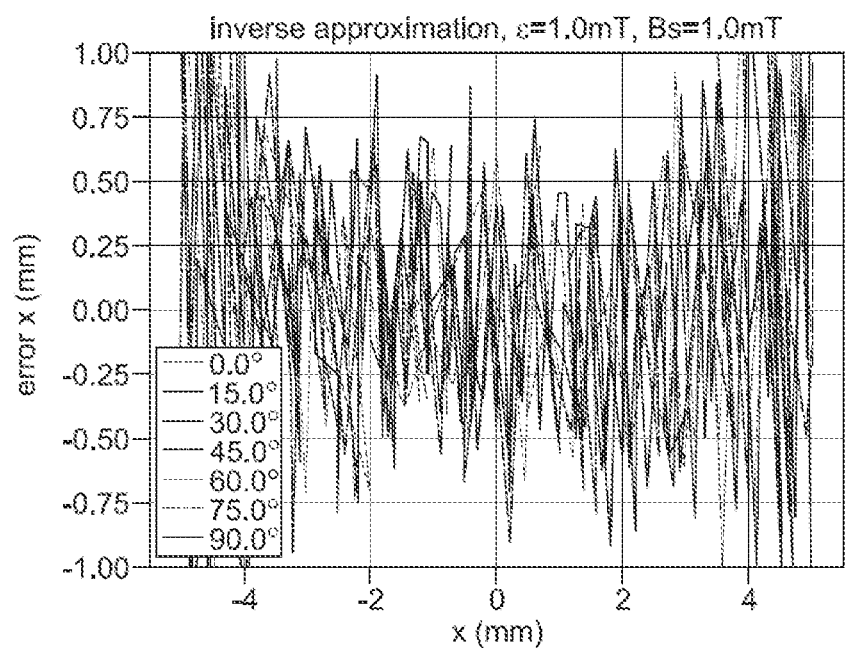
Figure 11C:
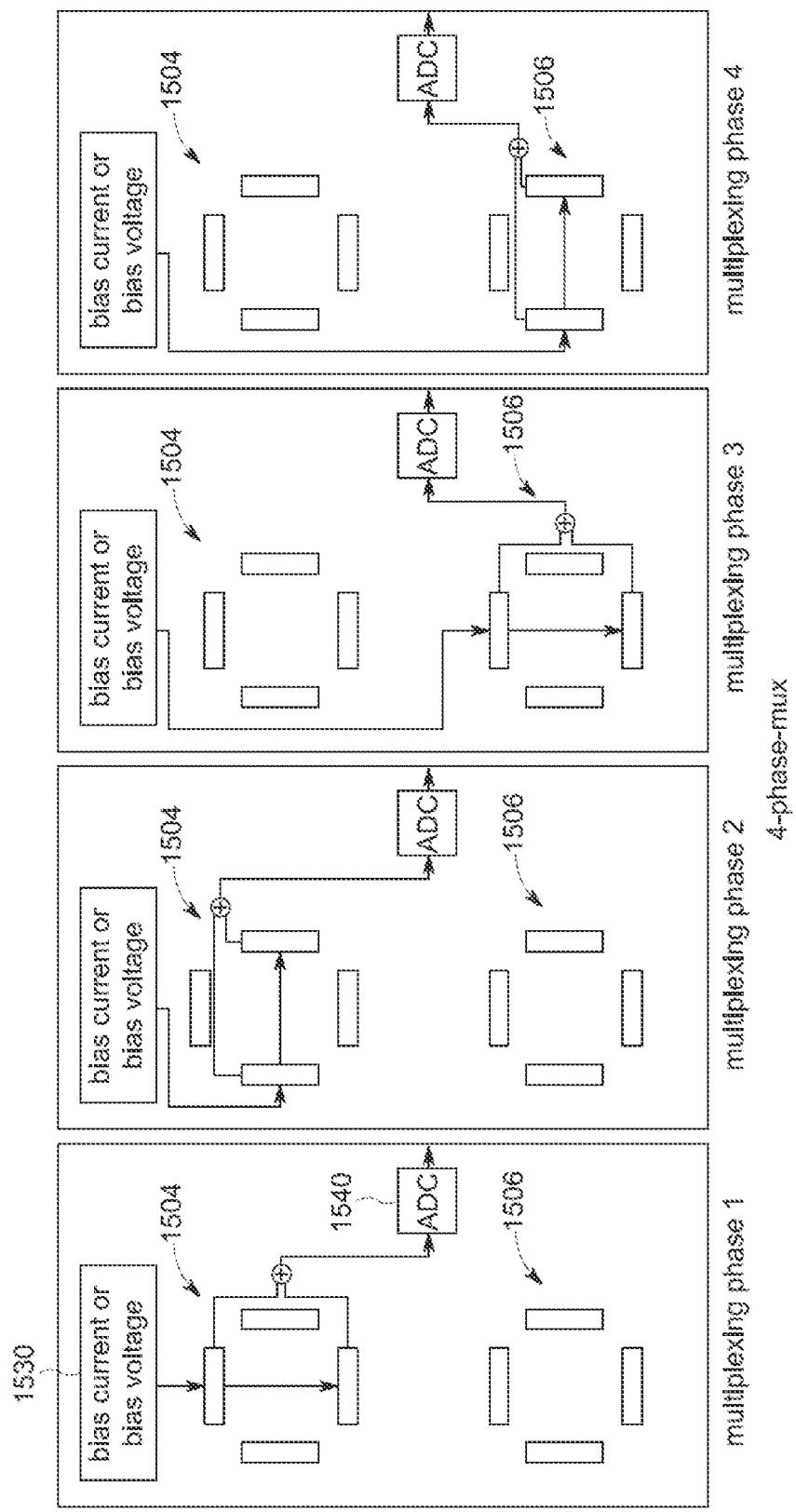
FIGS. 11c-11g shows examples of implementations of sensor systems according to different multiplexing methods.

FIG. 11c shows an example implementation of the sensor system for operating a first and second magnetic field sensor 1504, 1506 (e.g., vertical Hall sensors) according to a 4-phase multiplexing process. In the different phases, the magnetic field sensors 1504, 1506 are both operated via the same supply system 1530 and via the same ADC converter 1540. After the 4-phases of the multiplexing process the signals (e.g., vector length and angle) from each magnetic field sensor can be obtained for the position determination.

Figure 11D:
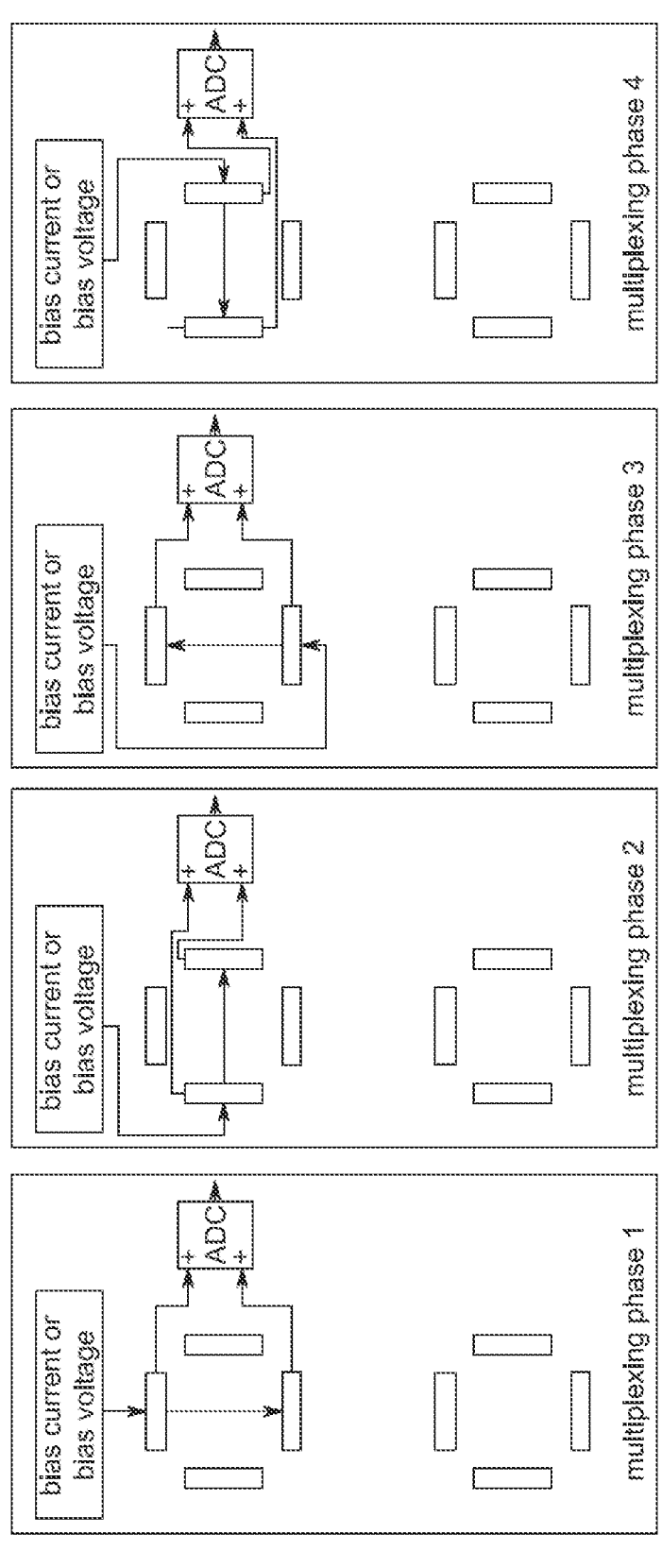
Figure 11E:
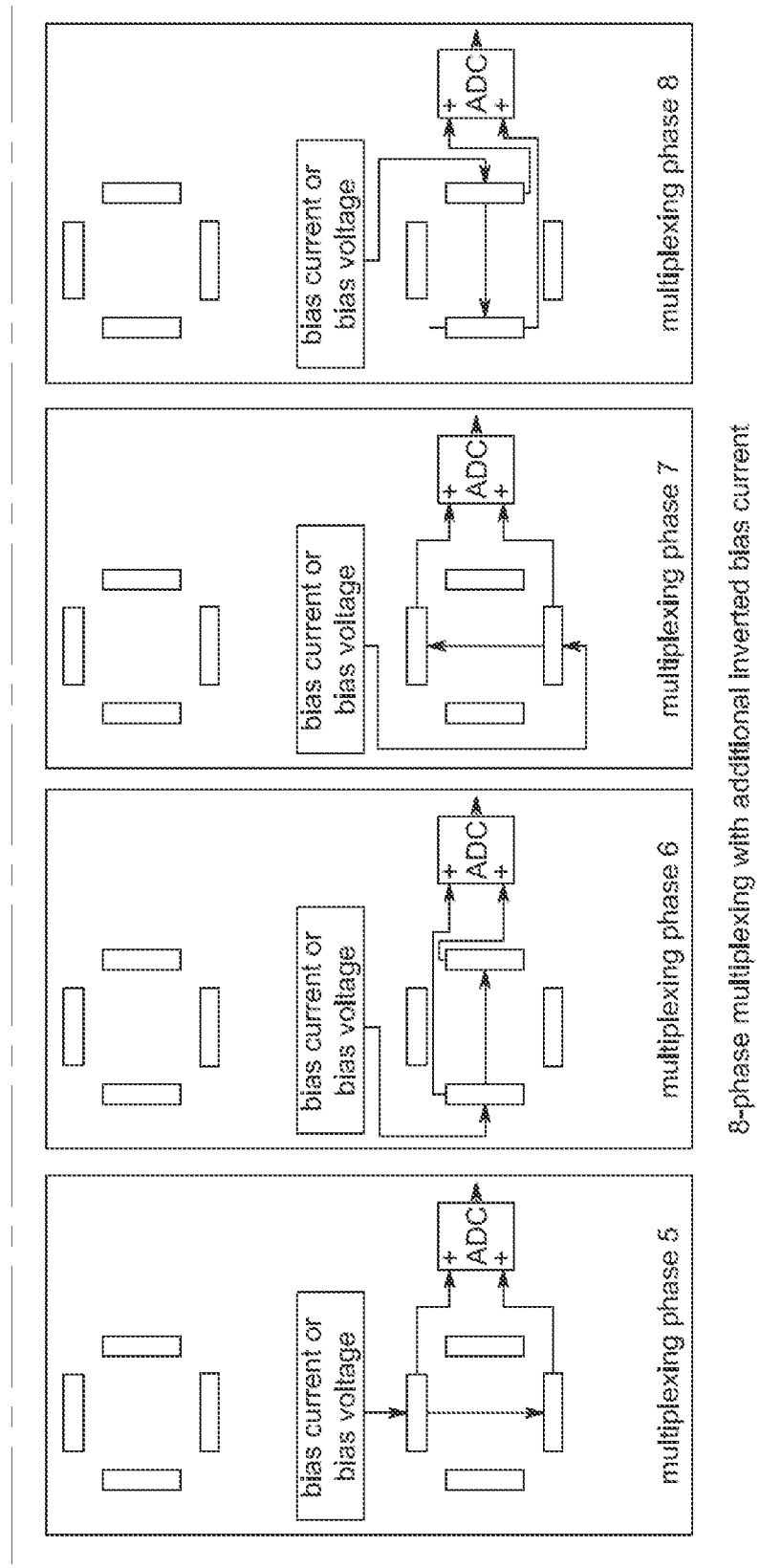

FIGS. 11d-11e show a further example implementation of a sensor system for operating a first and second magnetic field sensor according to an 8-phase multiplexing process. In comparison to the multiplexing process in FIG. 11c, in FIGS. 11d-11e, in phases 1, 2, 5 and 6 of the 8-phase multiplexing process the magnetic field sensors are operated with a bias current in the same direction, while in phases 3, 4, 7 and 8 of the 8-phase multiplexing process the magnetic field sensors are operated with a bias current in the reverse direction. After the 8 phases of the multiplexing process, the signals (e.g., vector length and angle) from each magnetic field sensor can be obtained for the position determination.

In another example, a sensor system could be operated according to a 16-phase multiplexing process. In a 16-phase multiplexing process, the magnetic field sensors could be operated with bias currents of four different directions (e.g., according to the spinning-current operating mode). In a multiplexed operation of sensor systems with multiple phases, sensor errors could be better compensated for or reduced, for example.

Figure 11F:
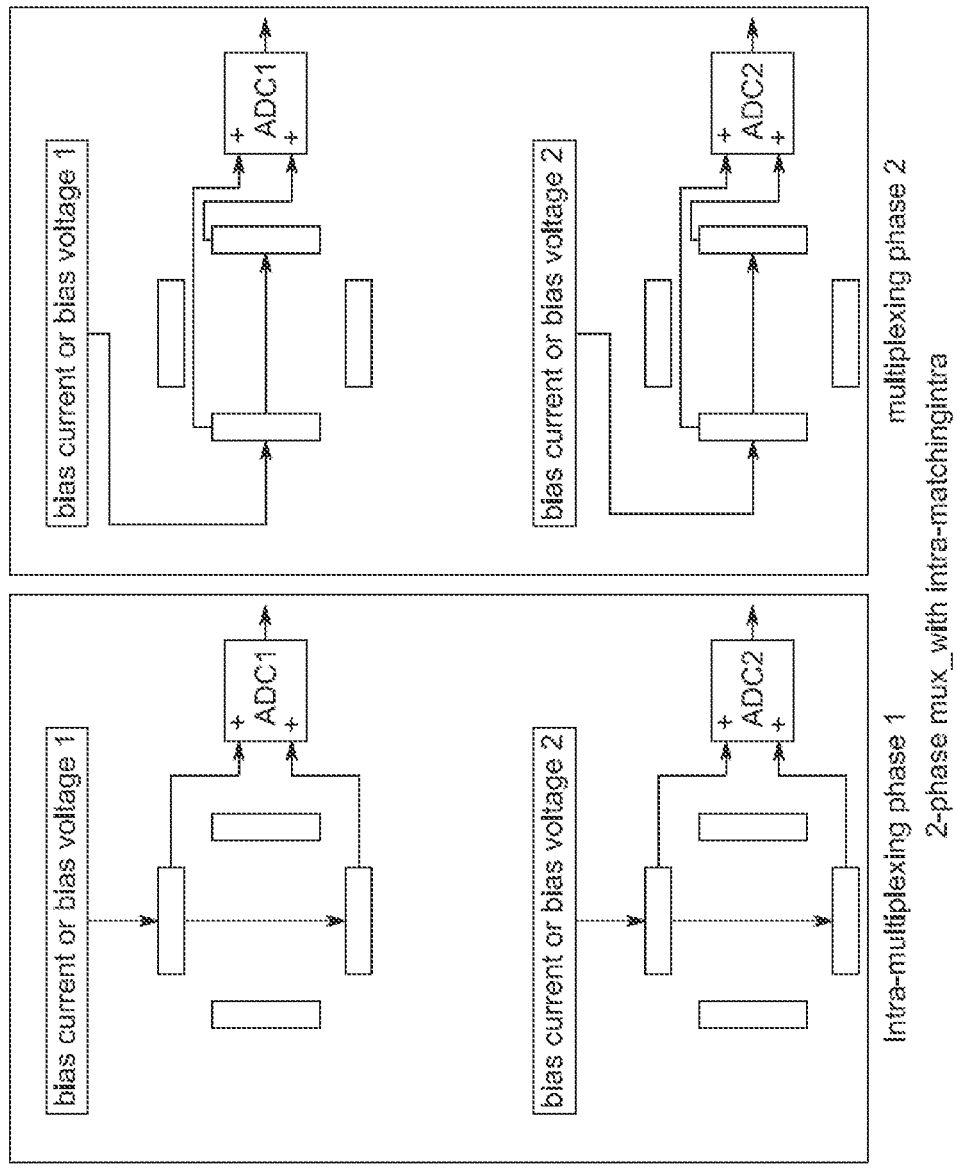

FIG. 11f shows a further example implementation of a sensor system for operating a first and second magnetic field sensor according to a 2-phase multiplexing process. Compared to the previous multiplexing methods in FIG. 11c and FIGS. 11d-11e, the first magnetic field sensor and the second magnetic field sensor are each operated with different supply systems and different ADC converters. Each (X and Y) component of the first magnetic field sensor uses a common supply system and a common ADC converter. The components of the second magnetic field sensor use a different common supply system and a different common ADC converter. After only 2 phases of the multiplexing process the signals (e.g., vector length and angle) from each magnetic field sensor can be obtained for the position determination. The sensor system shown in FIG. 11f can have good intra-matching and enable faster signal processing.

Figure 11G:
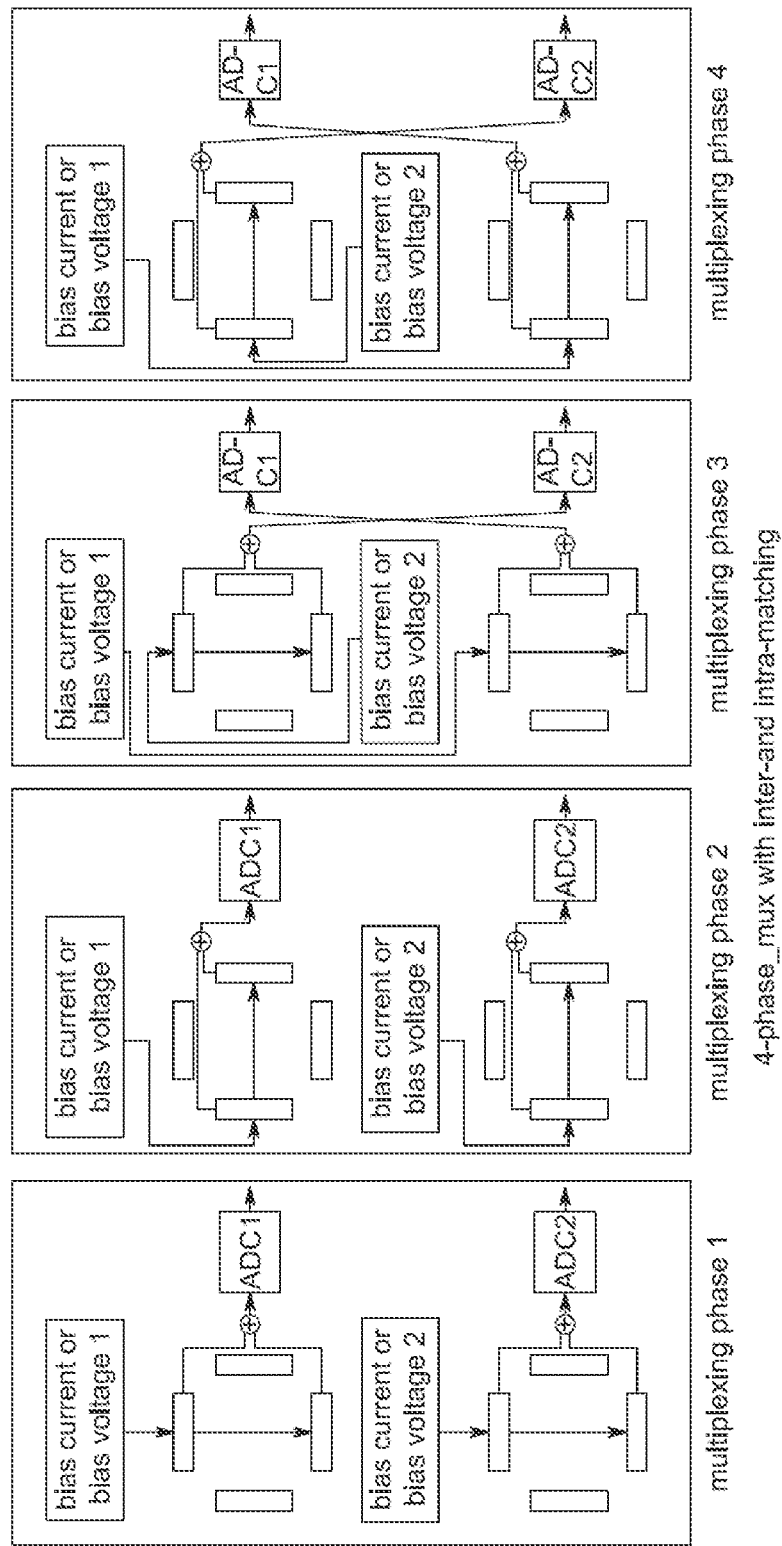

FIG. 11g shows a further example implementation of a sensor system for operating a first and second magnetic field sensor according to a 4-phase multiplexing process. The sensor system shown with the 4-phase multiplexing process comprises a total of two supply systems and two ADC converters. After the first two phases of the multiplexing process the signals (e.g., vector length and angle) can be obtained from each magnetic field sensor for the position determination. After two further phases (phase 3 and 4), the position could be determined more precisely. For example, in a first step, an initial relative position (via multiplexing with phases 1 and 2) could be determined. A second step could then be used to determine a new (more accurate, updated) relative position (via additional multiplexing with phases 3 and 4). As shown in FIG. 11g, the X and Y components of the first and second magnetic field sensors can be connected alternately to the supply systems and the ADC converters in the different phases. Compared to the previous multiplexing processes in FIGS. 11c-11f, the sensor system in FIG. 11g can have good intra- and inter-matching and/or enable a faster signal evaluation.

Designs of the sensor system are described below in connection with an operating unit and a method. The operating unit and the method for determining the position of a magnet system may comprise aspects of the sensor system that were described in connection with the preceding figures.

Figure 12:
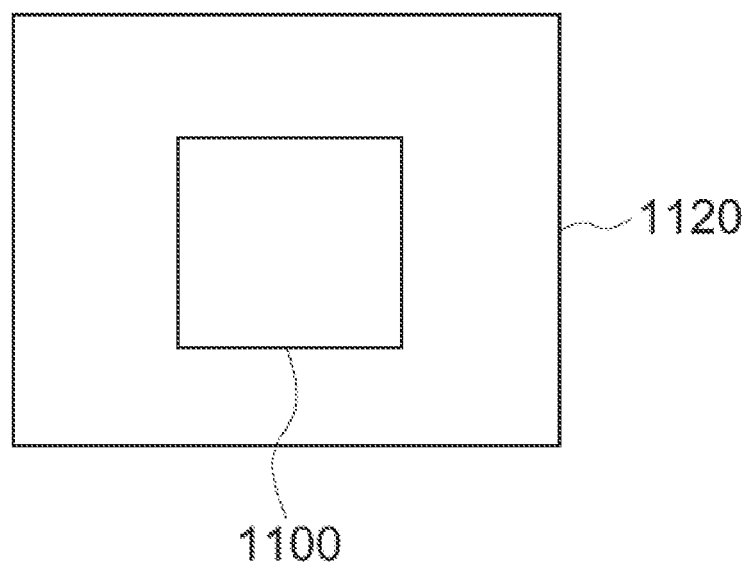
FIG. 12 shows an exemplary embodiment of an operating unit.

FIG. 12 shows an exemplary embodiment of an operating unit 1120 for input by a human operator and for outputting a signal representing the input. The control unit 1120 comprises a sensor system 1100 which can be implemented in a similar way to the sensor system according to one of the previous embodiments. For example, the operating unit is a turn signal switch, a handbrake lever, a gear lever, a gear lever fork, a multimedia control, or a joystick. For example, an input from the human operator can be made by using, switching, actuating, repositioning, pivoting, or shaking the unit. In general, the state of the operating unit 1120 can be changed by means of the input (e.g., by actuating a turn signal switch). The sensor system 1100 can determine the state (e.g., the position or the movement) of the operating unit. Depending on the specific position or movement, an output, such as an indicator signal, can be output.

Further details and optional aspects of the operating unit 1120 are described in conjunction with the proposed design or with one or more of the examples described above or below.

Figure 13:
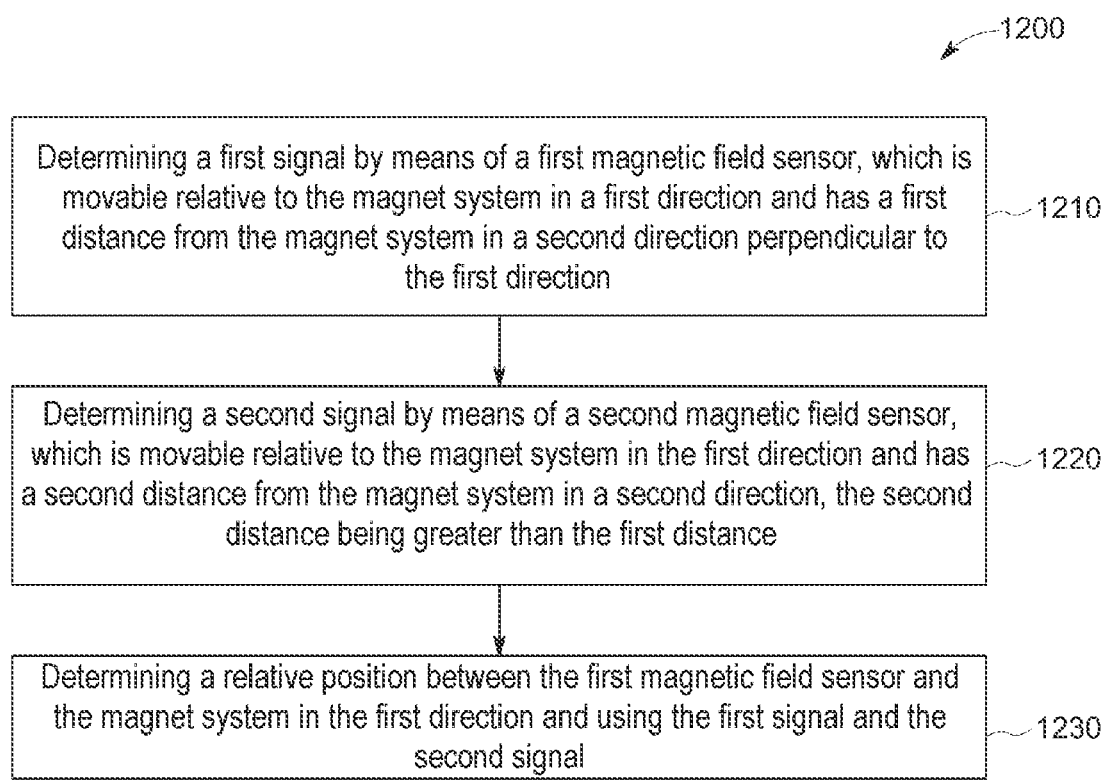
FIG. 13 shows a flowchart of an exemplary embodiment of a method for determining a position of a magnet system.

FIG. 13 shows a flowchart of an exemplary embodiment of a method 1200 for determining a position of a magnet system. The method 1200 comprises determining a first signal 1210 by means of a first magnetic field sensor which is movable in a first direction relative to the magnet system and has a first distance from the magnet system in a second direction perpendicular to the first direction. Furthermore, the method 1200 comprises determining a second signal 1220 by means of a second magnetic field sensor which is movable in the first direction relative to the magnet system and has a second distance from the magnet system in the second direction, the second distance being greater than the first distance. The method 1200 also comprises determining a relative position 1230 between the first magnetic field sensor and the magnet system in the first direction by using the first signal and the second signal.

Further details and optional aspects of the method 1200 for determining a position of a magnet system are described in conjunction with the proposed design or with one or more of the examples described above or below. For example, the method can determine the position of the magnet system according to one of the proposed designs for signal processing (e.g., using the inverse approximation or the forward formulation).

Figure 14:
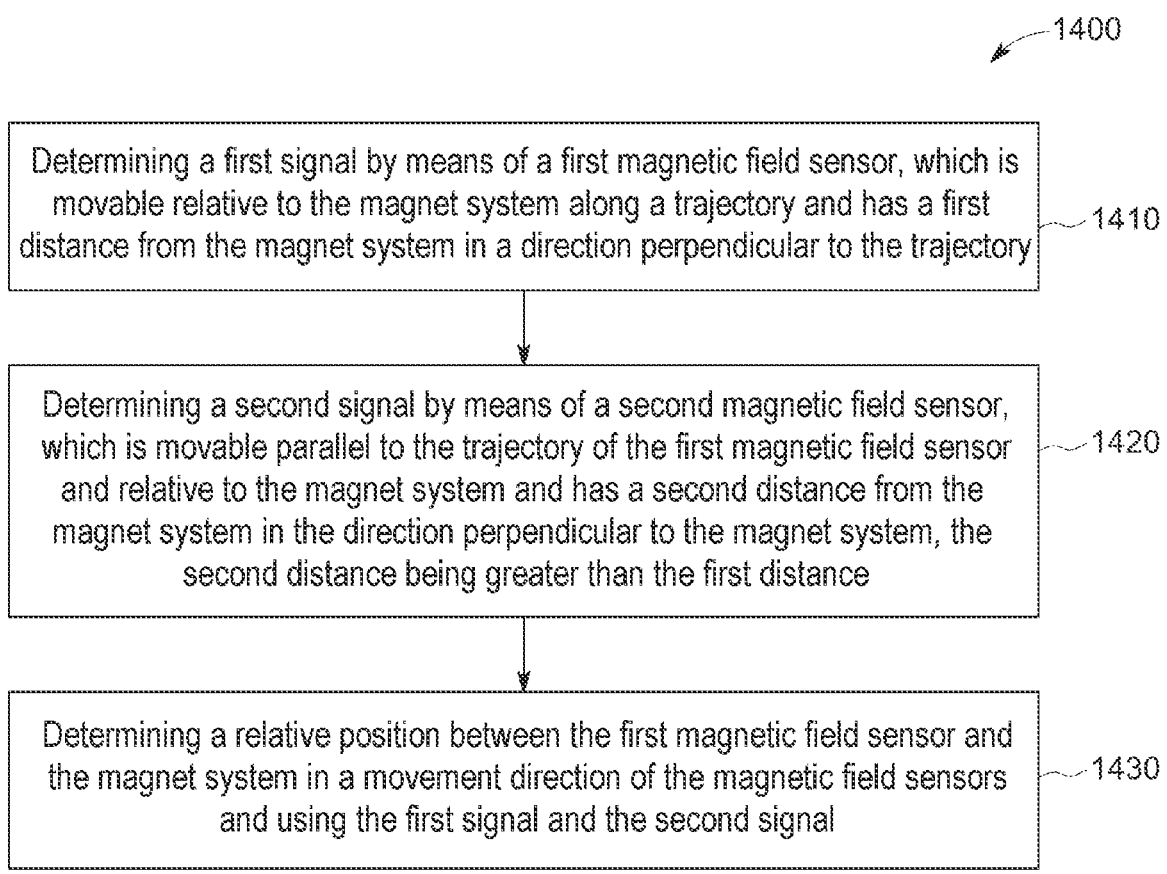
FIG. 14 shows a flowchart of an exemplary embodiment of a method for determining a position of a magnet system.

FIG. 14 shows a flowchart of an exemplary embodiment of a method 1400 for determining a position of a magnet system. The method 1400 comprises determining a first signal 1410 by means of a first magnetic field sensor which is movable along a trajectory relative to the magnet system and has a first distance from the magnet system in a direction perpendicular to the trajectory. Furthermore, the method 1400 comprises determining a second signal 1420 by means of a second magnetic field sensor which is movable parallel to the trajectory of the first magnetic field sensor and relative to the magnet system and has a second distance from the magnetic system in the direction perpendicular to the trajectory, the second distance being greater than the first distance. The method 1400 also comprises determining a relative position 1430 between the first magnetic field sensor and the magnet system in a direction of motion of the magnetic field sensors by using the first signal and the second signal.

Further details and optional aspects of the method 1400 for determining a position of a magnet system are described in conjunction with the proposed design or with one or more of the examples described above or below. For example, the method can determine the position of the magnet system according to one of the proposed signal processing designs (e.g., using the inverse approximation or the forward formulation).

The aspects and features which are described together with a specific one of the previously outlined examples can also be combined with one or more of the other examples in order to replace an identical or similar feature of this other example or to introduce the feature into the other example as an addition.

Examples can also be or relate to a (computer) program having a program code for executing one or more of the above methods when the computer program is executed on a computer, a processor or other programmable hardware component. Steps, operations or processes of various methods described above can thus also be executed by programmed computers, processors or other programmable hardware components. Examples can also include program storage devices, such as digital data storage media, which are readable by machines, processors or computers and can encode or contain machine-executable, processor-executable or computer-executable programs and instructions. The program storage devices can comprise or be, for example, digital memories, magnetic storage media such as magnetic disks and magnetic tapes, hard disk drives, or optically readable digital data storage media. Other examples may include computers, processors, control units, (field) programmable logic arrays ((F)PLAs), (field) programmable gate arrays ((F)PGAs), graphics processor units (GPUs), application-specific integrated circuits (ASICs), integrated circuits (ICs), or single-chip systems (System-on-a-Chip, SoC) which are programmed to execute the steps of the above-described methods.

It also goes without saying that the disclosure of a plurality of steps, processes, operations or functions disclosed in the description or the claims should not be interpreted as being necessarily configured to be in the specified order, unless this is explicitly or implicitly stated otherwise, for example, for technical reasons. Therefore, the preceding description does not limit the performance of multiple steps or functions to a specific order. Also, in some examples a single step, a single function, process or operation can include a plurality of sub-steps, sub-functions, sub-processes or sub-operations and/or be broken down into the same.

If some aspects of the preceding sections have been described in relation to a device or a system, these aspects should also be understood as a description of the corresponding method. For example, a block, a device or a functional aspect of the device or system may correspond to a characteristic, such as a method step, of the corresponding method. Accordingly, aspects described in connection with a method should also be understood as a description of a corresponding block, a corresponding element, a property or a functional feature of a corresponding device or a corresponding system.

In addition, the following claims are hereby incorporated into the detailed description, where each claim can stand for a separate example in itself. It is also important to note that, although a dependent claim in the claims may relate to a specific combination with one or more other claims, other examples may also comprise a combination of the dependent claim with the subject matter of any other dependent or independent claim. Such combinations are explicitly proposed herewith, except where it is specified in individual cases that a certain combination is not intended. In addition, features of a claim should also be included for any other independent claim, even if this claim is not directly defined as being dependent on this other independent claim.

What is claimed is:

1. A sensor system for use in a control lever or a control stick, comprising:
   a magnet system configured to generate a magnetic field;
   a first magnetic field sensor that is movable in a first direction relative to the magnet system and has a first distance from the magnet system in a second direction perpendicular to the first direction,
      wherein the first magnetic field sensor comprises a first plurality of sensor elements of the same sensitivity in a first axis direction and a second plurality of sensor elements of the same sensitivity in a second axis direction;
   a second magnetic field sensor that is movable in the first direction relative to the magnet system and has a second distance from the magnet system in the second direction, the second distance being greater than the first distance,
      wherein the second magnetic field sensor comprises a third plurality of sensor elements of the same sensitivity in the first axis direction and a fourth plurality of sensor elements of the same sensitivity in the second axis direction,
      wherein the first magnetic field sensor and the second magnetic field sensor are movable along a trajectory that is associated with a circular path around the magnet system at the first distance and at the second distance respectively; and
   a signal processing circuit configured to:
      determine a difference between a first signal associated with the first magnetic field sensor and a second signal associated with the second magnetic field sensor; and
      determine, based on the difference, a relative position between the first magnetic field sensor and the magnet system.

2. The sensor system as claimed in claim 1, wherein:
   the first and the second magnetic field sensors are two-dimensional magnetic field sensors which are sensitive in the first direction and the second direction.

3. The sensor system as claimed in claim 1 or 2, wherein:
   the first and second magnetic field sensors are Hall sensors or fluxgate magnetometers.

4. The sensor system as claimed in claim 1, wherein:
   the first and second magnetic field sensors are arranged on a common straight line that extends in the second direction.

5. The sensor system as claimed in claim 1, wherein:
   the signal processing circuit is configured to determine a ratio between the first signal and the second signal and determine the relative position between the first magnetic field sensor and the magnet system based on the ratio.

6. The sensor system as claimed in claim 1, wherein:
   the signal processing circuit is configured to determine the relative position numerically, assuming errors at least with respect to a superimposed external magnetic field or a magnetic field sensor device.

7. The sensor system as claimed in claim 1, wherein:
   the signal processing circuit is configured to minimize a function based on a deviation between a theoretical state of the magnetic field and a magnetic field determined by the first and the second signals, in order to determine the relative position.

8. The sensor system as claimed in claim 7, wherein:
   the signal processing circuit is configured to minimize the function based on an expected size of errors, at least with respect to an external magnetic field or a magnetic field sensor device.

9. The sensor system as claimed in claim 1, wherein:
   the signal processing circuit is configured to determine the relative position by using a machine learning algorithm.

10. The sensor system as claimed in claim 1, wherein:
    the first and the second magnetic field sensors are operated with at least one common supply system according to a multiplexing procedure.

11. A sensor system for use in a control lever or a control stick, comprising:
    a magnet system configured to generate a magnetic field;
    a first magnetic field sensor that is movable relative to the magnet system along a trajectory and has a first distance from the magnet system in a direction perpendicular to the trajectory,
       wherein the first magnetic field sensor comprises a first plurality of sensor elements of the same sensitivity in a first axis direction and a second plurality of sensor elements of the same sensitivity in a second axis direction;
    a second magnetic field sensor that is movable parallel to the trajectory of the first magnetic field sensor and relative to the magnet system and has a second distance from the magnet system in the direction perpendicular to the trajectory, the second distance being greater than the first distance,
       wherein the second magnetic field sensor comprises a third plurality of sensor elements of the same sensitivity in the first axis direction and a fourth plurality of sensor elements of the same sensitivity in the second axis direction, wherein the first magnetic field sensor and the second magnetic field sensor are movable along a trajectory that is associated with a circular path around the magnet system at the first distance and at the second distance respectively; and a signal processing component configured to:
  determine a difference between a first signal associated with the first magnetic field sensor and a second signal associated with the second magnetic field sensor; and
  determine, based on the difference, a relative position between the first magnetic field sensor and the magnet system.

12. The sensor system as claimed in claim 11, wherein: the first and the second magnetic field sensors are arranged on a common straight line that extends in the direction perpendicular to the trajectory.

13. The sensor system as claimed in claim 11, wherein: the trajectory is a circular path that extends around the magnet system.

14. The sensor system as claimed in claim 11, wherein: the first and the second magnetic field sensors are part of a joystick and the trajectory is derived from a movement of the joystick.

15. A method for determining a position of a magnet system, for use in a control lever or a control stick, comprising:
  generating a first signal by a first magnetic field sensor that is movable in a first direction relative to the magnet system and has a first distance from the magnet system in a second direction perpendicular to the first direction;
  generating a second signal by a second magnetic field sensor which is movable in the first direction relative to the magnet system and has a second distance from the magnet system in the second direction, the second distance being greater than the first distance,
    wherein the first magnetic field sensor and the second magnetic field sensor are movable along a trajectory that is associated with a circular path around the magnet system at the first distance and at the second distance respectively; and
  determining, based on determining a difference between the first signal and the second signal, a relative position between the first magnetic field sensor and the magnet system in the first direction.

16. A method for determining a position of a magnet system, for use in a control lever or a control stick, comprising:
  generating a first signal by a first magnetic field sensor that is movable relative to the magnet system along a trajectory and has a first distance from the magnet system in a direction perpendicular to the trajectory;
  generating a second signal by a second magnetic field sensor that is movable parallel to the trajectory of the first magnetic field sensor and relative to the magnet system and has a second distance from the magnet system in the direction perpendicular to the trajectory, the second distance being greater than the first distance,
    wherein the first magnetic field sensor and the second magnetic field sensor are movable along a trajectory that is associated with a circular path around the magnet system at the first distance and at the second distance respectively; and
  determining, based on determining a difference between the first signal and the second signal, a relative position between the first magnetic field sensor and the magnet system in a direction of motion of the magnetic field sensors.

17. An operating unit for input by a human operator and for outputting a signal representing the input, for use in a control lever or a control stick, comprising:
  a magnet system configured to generate a magnetic field;
  a first magnetic field sensor that is movable in a first direction relative to the magnet system and has a first distance from the magnet system in a second direction perpendicular to the first direction, wherein the first magnetic field sensor is configured to generate a first signal based on the magnetic field,
    wherein the first magnetic field sensor comprises a first plurality of sensor elements of the same sensitivity in a first axis direction and a second plurality of sensor elements of the same sensitivity in a second axis direction;
  a second magnetic field sensor that is movable in the first direction relative to the magnet system and has a second distance from the magnet system in the second direction, the second distance being greater than the first distance, wherein the second magnetic field sensor is configured to generate a second signal based on the magnetic field,
    wherein the second magnetic field sensor comprises a third plurality of sensor elements of the same sensitivity in the first axis direction and a fourth plurality of sensor elements of the same sensitivity in the second axis direction,
    wherein the first magnetic field sensor and the second magnetic field sensor are movable along a trajectory that is associated with a circular path around the magnet system at the first distance and at the second distance respectively; and
  a signal processing circuit configured to determine a relative position between the first magnetic field sensor and the magnet system in the first direction by using the first signal of the first magnetic field sensor and the second signal of the second magnetic field sensor and generate the signal based on the determined relative position,
    wherein the relative position is determined based on determining a difference between the first signal and the second signal.

18. The operating unit as claimed in claim 17, wherein the operating unit is associated with at least one of a turn signal switch, a handbrake lever, a gear lever, a gear lever fork, a multimedia control, or a joystick.

19. A non-transitory computer-readable medium comprising a computer program having a program code for causing a programmable hardware device to execute a method comprising the steps of claim 15.

20. The sensor system as claimed in claim 11, wherein the first and the second magnetic field sensors are two-dimensional magnetic field sensors which are sensitive in a first direction and a second direction.

21. The sensor system as claimed in claim 11, wherein the first magnetic field sensor is operated with a first supply system and a first analog-to-digital converter,
  wherein the second magnetic field sensor is operated with a second supply system and a second analog-to-digital converter (ADC), and
  wherein the first and second supply systems and the first and second ADCs are utilized in a multi-phase multiplex process.

* * * * *